US012575275B2

(12) United States Patent　　　　(10) Patent No.:　US 12,575,275 B2

Lu et al.　　　　　　　　　　　　　(45) Date of Patent:　　Mar. 10, 2026

(54) DISPLAY SUBSTRATE AND DISPLAY APPARATUS

(71) Applicants:Chengdu BOE Optoelectronics Technology Co., Ltd., Chengdu (CN); BOE Technology Group Co., Ltd., Beijing (CN)

(72) Inventors: Yanwei Lu, Beijing (CN); Fengli Ji, Beijing (CN); Zhenli Zhou, Beijing (CN); Hongjun Zhou, Beijing (CN); Chengjie Qin, Beijing (CN); Yudiao Cheng, Beijing (CN); Quan Shi, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 418 days.

(21) Appl. No.: 18/029,380

(22) PCT Filed: Jun. 29, 2022

(86) PCT No.: PCT/CN2022/102421

§ 371 (c)(1),
(2) Date: Mar. 30, 2023

(87) PCT Pub. No.: WO2024/000287

PCT Pub. Date: Jan. 4, 2024

(65) Prior Publication Data

US 2025/0081759 A1　　　Mar. 6, 2025

(51) Int. Cl.
H10K 59/131　　　(2023.01)
H10K 59/80　　　(2023.01)
H10K 59/88　　　(2023.01)

(52) U.S. Cl.
CPC ......... H10K 59/131 (2023.02); H10K 59/873 (2023.02); H10K 59/88 (2023.02)

(58) Field of Classification Search
CPC .... H10D 86/00; H10D 99/00; H10K 59/8722; H10K 59/88; H10K 59/873; H10K 59/131; H10K 71/70
See application file for complete search history.

(56) References Cited

U.S. PATENT DOCUMENTS

2007/0170846 A1　　7/2007　Choi et al.
2017/0023641 A1　　1/2017　Gan
　　　　　　　　(Continued)

FOREIGN PATENT DOCUMENTS

CN　　　101344650 A　　1/2009
CN　　　102184936 A　　9/2011
　　　　　　　(Continued)

*Primary Examiner* — Vongsavanh Sengdara

(74) *Attorney, Agent, or Firm* — Ling Wu; Stephen Yang; Ling and Yang Intellectual Property

(57)　　　　　　ABSTRACT

A display substrate includes a base substrate, a first encapsulation adhesive base substrate, multiple first signal lead lines, multiple test connection traces and multiple test signal access pins. The base substrate at least includes a display area and a peripheral area located on a side of the display area. The first encapsulation adhesive base substrate is located in the peripheral area. The multiple first signal lead lines, the multiple test connection traces, and the multiple test signal access pins are located on a side of the first encapsulation adhesive base substrate away from the display area. At least one first signal lead line is electrically connected with at least one test signal access pin through at least one test connection trace.

20 Claims, 13 Drawing Sheets

(56)           References Cited

U.S. PATENT DOCUMENTS

| | | | |
|---|---|---|---|
| 2018/0173277 A1 | 6/2018 | Lee | |
| 2020/0373371 A1 | 11/2020 | Liu et al. | |
| 2021/0110745 A1 | 4/2021 | Jung et al. | |
| 2021/0273033 A1 | 9/2021 | Hsu | |
| 2022/0077273 A1 | 3/2022 | Qing et al. | |
| 2023/0361132 A1* | 11/2023 | Gao | H10D 86/443 |
| 2024/0114722 A1* | 4/2024 | Zhang | H10K 50/8426 |

FOREIGN PATENT DOCUMENTS

| | | |
|---|---|---|
| CN | 104617007 A | 5/2015 |
| CN | 105139787 A | 12/2015 |
| CN | 110729311 A | 1/2020 |
| CN | 112259578 A | 1/2021 |
| CN | 112838106 A | 5/2021 |
| CN | 113327946 A | 8/2021 |
| CN | 113380656 A | 9/2021 |
| CN | 113540377 A | 10/2021 |
| KR | 10-2021-0044356 A | 4/2021 |

* cited by examiner

402

401                403

Y
↑
└→X

441

442

443

411

421                431

444    445    446

Y
↑
└→X

1

DISPLAY SUBSTRATE AND DISPLAY APPARATUS

CROSS-REFERENCE TO RELATED APPLICATION

This application is a national stage application of PCT Application No. PCT/CN2022/102421, which is filed on Jun. 29, 2022, and entitled "Display Substrate and Display Apparatus", the content of which should be regarded as being incorporated herein by reference.

TECHNICAL FIELD

The present disclosure relates to, but is not limited to, the field of display technology, in particular to a display substrate and a display apparatus.

BACKGROUND

With the constant development of a display technology, more and more types of display products have emerged, e.g., a Liquid Crystal Display (LCD), an Organic Light-Emitting Diode (OLED) display, a Plasma Display Panel (PDP), and a Field Emission Display (FED).

SUMMARY

The following is a summary of subject matters described herein in detail. The summary is not intended to limit the protection scope of claims.

Embodiments of the present disclosure provide a display substrate and a display apparatus.

In one aspect, an embodiment of the present disclosure provides a display substrate, and the display substrate includes a base substrate, a first encapsulation adhesive base substrate, multiple first signal lead lines, multiple test connection traces, and multiple test signal access pins. The base substrate at least includes a display area and a peripheral area located at a side of the display area. The first encapsulation adhesive base substrate is located in the peripheral area. The multiple first signal lead lines, the multiple test connection traces, and the multiple test signal access pins are located on a side of the first encapsulation adhesive base substrate away from the display area. At least one first signal lead line is electrically connected with at least one test signal access pin through at least one test connection trace. The connection position of the at least one first signal lead line and the at least one test connection trace is not overlapped with an orthographic projection of the first encapsulation adhesive base substrate on the base substrate.

In some exemplary implementations, the display substrate may further include an encapsulation cover plate disposed on the base substrate, and the connection position of the at least one first signal lead line and the at least one test connection trace is away from the encapsulation cover plate.

In some exemplary implementations, the peripheral area includes at least one test signal access region located on a side of the display area, and a first area located between the display area and the test signal access region. The multiple test signal access pins are located in the test signal access region, and the first encapsulation adhesive base substrate, the multiple first signal lead lines, and the multiple test connection traces are at least located in the first area.

In some exemplary implementations, the display substrate may further include a first organic insulation layer disposed on the base substrate, and an orthographic projection of the first organic insulation layer on the base substrate covers the connection position of the at least one first signal lead line and the at least one test connection trace.

In some exemplary implementations, a distance between an edge of the first organic insulation layer close to the display area and an edge of the first encapsulation adhesive base substrate on a side away from the display area is greater than or equal to 50 microns.

In some exemplary implementations, the multiple first signal lead lines are configured to transmit at least one of the following signals: a scan start signal, a scan clock signal, a light-emitting start signal, a light-emitting clock signal, a drive power supply signal, a test data signal, and a test control signal.

In some exemplary implementations, in a direction perpendicular to the display substrate, the first encapsulation adhesive base substrate and the multiple test connection traces are located on a side of the multiple first signal lead lines away from the base substrate.

In some exemplary implementations, the first encapsulation adhesive base substrate and the multiple test connection traces are in a same layer structure.

In some exemplary implementations, the peripheral area includes a signal access region and a test signal access region located on a side of the display area along a second direction, the signal access region is adjacent to the test signal access region in a first direction, and the first direction intersects with the second direction; the multiple test signal access pins are located in the test signal access region. The signal access region includes multiple signal access pins disposed on the base substrate. The at least one first signal lead line is electrically connected with the at least one signal access pin.

In some exemplary implementations, the display substrate further includes at least one first auxiliary mark, and the first auxiliary mark is located on a side of the test signal access region away from the signal access region in the first direction. The multiple test connection lines are located between the first auxiliary mark and the first encapsulation adhesive base substrate in the second direction. The connection position of the at least one first signal lead line and the at least one test connection trace is located on a side of the first auxiliary mark away from the test signal access region in the first direction.

In some exemplary implementations, the display substrate further includes at least one second auxiliary mark, and the second auxiliary mark is located on a side of the first auxiliary mark away from the test signal access region in the first direction. The connection position of the at least one first signal lead line and the test connection line is located on a side of the second auxiliary mark close to the first auxiliary mark in the first direction.

In some exemplary implementations, the second auxiliary mark and the first encapsulation adhesive base substrate are an integral structure.

In some exemplary implementations, the at least one first signal lead line includes a first bent portion protruding toward a side of the second auxiliary mark; the at least one test connection trace is electrically connected with the first bent portion of the at least one first signal lead line.

In some exemplary implementations, the first encapsulation adhesive base substrate is electrically connected with a first power supply line.

In some exemplary implementations, the display substrate further includes a second encapsulation adhesive located on the first encapsulation glue base substrate.

In some exemplary implementations, the display substrate further includes a test circuit. The test circuit includes at least one test unit, the test unit includes multiple test transistors, first electrodes of the multiple test transistors are respectively electrically connected with different test data lines through a first data connection line, second electrodes of the multiple test transistors are respectively connected with different data lines of the display area, and gate electrodes of the multiple test transistors are electrically connected with a test control signal line. The first data connection line and the gate electrodes of the multiple test transistors are in a same layer structure.

In some exemplary implementations, the gate electrodes of the multiple test transistors of the test unit are an integral structure.

In some exemplary implementations, the test circuit is located on a side of the display area away from the test signal access region and is electrically connected with a portion of the first signal lead lines.

In some exemplary implementations, the display substrate further includes multiple multiplexer circuits. The multiple multiplexer circuits include at least one multiplexer unit, the multiplexer unit includes multiple multiplexer transistors, first electrodes of the multiple multiplexer transistors are electrically connected with a multiplexer data line, second electrodes of the multiple multiplexer transistors are electrically connected with different data lines of the display area through second data connection lines, and gate electrodes of the multiple multiplexer transistors are electrically connected with different multiplexer control signal lines. The second data connection line and the gate electrodes of the multiple multiplexer transistors are in a same layer structure.

In another aspect, an embodiment of the present disclosure provides a display apparatus, which includes the aforementioned display substrate.

Other aspects may be understood upon reading and understanding the drawings and the detailed description.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure but not to constitute limitations on the technical solutions of the present disclosure. Shapes and sizes of one or more components in the drawings do not reflect true scales, and are only intended to schematically describe contents of the present disclosure.

DETAILED DESCRIPTION

Figure 1:
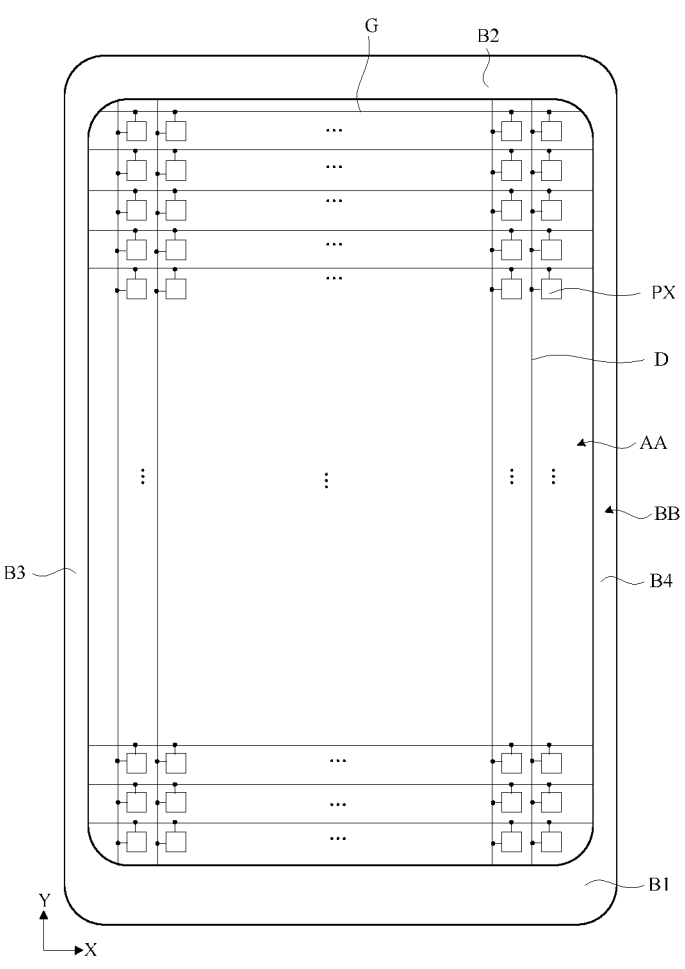
FIG. 1 is a schematic diagram of an appearance of a display apparatus.

The embodiments of the present disclosure will be described below in combination with the drawings in detail. Implementations may be implemented in a plurality of different forms. Those of ordinary skill in the art may easily understand such a fact that manners and contents may be transformed into other forms without departing from the purpose and scope of the present disclosure. Therefore, the present disclosure should not be explained as being limited to contents described in following implementation modes only. The embodiments in the present disclosure and features in the embodiments may be combined randomly with each other without conflict.

In the drawings, a size of one or more constituent elements, a thickness of a layer, or a region is sometimes exaggerated for clarity. Therefore, a mode of the present disclosure is not necessarily limited to the size, and a shape and a size of one or more components in the drawings do not reflect a true scale. In addition, the drawings schematically illustrate ideal examples, and one implementation of the present disclosure is not limited to the shapes, numerical values, or the like shown in the drawings.

Ordinal numerals such as "first", "second", and "third" in the specification are set to avoid confusion of constituent elements, but not to set a limit in quantity. In the present disclosure, "a plurality of" represents two or more than two.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between constituent elements are changed as appropriate according to a direction where the constituent elements are described. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, a detachable connection, or an integrated connection; it may be a mechanical connection or a connection; it may be a direct connection, an indirect connection through an intermediate component, or communication inside two components. Those of ordinary skills in the art may understand meanings of the aforementioned terms in the present disclosure according to situations.

In the specification, "electrical connection" includes a case that constituent elements are connected together through an element with a certain electrical effect. The "element having some electrical function" is not particularly limited as long as electrical signals between the connected constituent elements may be transmitted. Examples of the "element having some electrical function" not only include an electrode and a wiring, but further include a switch element such as a transistor, a resistor, an inductor, a capacitor, another element with a plurality of functions, etc.

In the specification, a transistor refers to an element which at least includes three terminals, i.e., a gate, a drain, and a source. The transistor has a channel region between the drain electrode (drain electrode terminal, drain region, or drain) and the source electrode (source electrode terminal, source region, or source), and a current may flow through the drain electrode, the channel region, and the source electrode. In the specification, the channel region refers to a region through which a current mainly flows.

In the specification, to distinguish two electrodes of a transistor except a gate electrode, one of the electrodes is referred to as a first electrode and the other electrode is referred to as a second electrode. The first electrode may be a source electrode or a drain electrode, and the second electrode may be a drain electrode or a source electrode. In addition, the gate electrode of the transistor is referred to as a control electrode. In a case that transistors with opposite polarities are used, or in a case that a direction of a current changes during work of a circuit, or the like, functions of the "source electrode" and the "drain electrode" may sometimes be exchangeable. Therefore, the "source electrode" and the "drain electrode" may be exchangeable in the specification.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

Triangle, rectangle, trapezoid, pentagon and hexagon in the specification are not strictly defined, and they may be approximate triangle, rectangle, trapezoid, pentagon or hexagon, etc. There may be some small deformation caused by tolerance, and there may be chamfer, arc edge and deformation, etc.

In the present disclosure, "about" and "substantially" refer to a case that a boundary is not defined strictly and a process and measurement error within a range is allowed. In the present disclosure, "substantially the same" is a case where values differ by less than 10%.

In the present disclosure, "A extends in a B direction" means that A may include a main body portion, which is a line, a line segment or a strip-shaped body, and a secondary portion connected with the main body portion, the main body portion extends in the B direction, and a length of the main body portion extending in the B direction is greater than a length of the secondary portion extending in another direction. In the following description, "A extends in a B direction" means "the main body portion of A extends in a B direction".

FIG. 1 is a schematic diagram of an appearance of a display apparatus, the appearance has a rectangular shape with rounded chamfers. The display apparatus may include a display substrate. In some examples, the display substrate may be a closed polygon including linear edges, a circle or an ellipse including a curved edge, a semicircle or semiellipse including a linear edge and a curved edge, or the like. In some examples, when the base substrate has a linear side, at least some corners of the base substrate may be curved. When the base substrate is in a shape of a rectangle, a portion at a position where adjacent linear sides intersect each other may be replaced by a curve with a predetermined curvature. Among them, the curvature may be set according to different positions of the curve. For example, the curvature may be changed according to a starting position of the curve, a length of the curve, etc.

In some examples as shown in FIG. 1, the display substrate may include a display area AA and a peripheral area BB surrounding the display area AA. In some examples, the display area AA may include a first edge (lower edge) and a second edge (upper edge) oppositely disposed in a second direction Y, and a third edge (left edge) and a fourth edge (right edge) oppositely disposed in a first direction X. Adjacent edges can be connected by an arc chamfer to form a quadrilateral shape with rounded chamfers. In some examples, the peripheral area BB may include a first frame (lower frame) B1 and a second frame (upper frame) B2 oppositely disposed in the second direction Y, and a third frame (left frame) B3 and a fourth frame (right frame) B4 oppositely disposed in the first direction X. The first frame B1 is in communication with the third frame B3 and the fourth frame B4, and the second frame B2 is in communication with the third frame B3 and the fourth frame B4.

In some examples as shown in FIG. 1, the display area AA at least includes multiple sub-pixels PX, multiple gate lines G, and multiple data lines D. The multiple gate lines G may extend in the first direction X, and the multiple data lines D may extend in the second direction Y. Orthographic projections of the multiple gate lines G on the base substrate intersect orthographic projections of the multiple data lines D on the base substrate to form multiple sub-pixel areas, and one sub-pixel PX is disposed in each sub-pixel area. The multiple data lines D are electrically connected with multiple sub-pixels PX and the multiple data lines D may be configured to provide data signals to the multiple sub-pixels PX. The multiple gate lines G are electrically connected with the multiple sub-pixels PX and the multiple gate lines G may be configured to provide gate control signals to the multiple sub-pixels PX. In some examples, the gate control signal may include a scan signal and a light-emitting control signal.

In some examples as shown in FIG. 1, the first direction X may be an extension direction of a gate line G in the display area (row direction), and the second direction Y may be an extension direction of a data line D in the display area (column direction). The first direction X and the second direction Y may be perpendicular to each other.

In some examples, a pixel unit of the display area AA may include three sub-pixels, wherein the three sub-pixels are respectively a red sub-pixel, a green sub-pixel, and a blue sub-pixel. However, this embodiment is not limited thereto. In some examples, a pixel unit may include four sub-pixels, wherein the four sub-pixels are respectively a red sub-pixel, a green sub-pixel, a blue sub-pixel, and a white sub-pixel.

In some examples, the shape of the sub-pixel may be a rectangle, a rhombus, a pentagon, or a hexagon. When a pixel unit includes three sub-pixels, the three sub-pixels may be arranged side by side horizontally, side by side vertically, or in a shape of a Chinese character "品". When a pixel unit includes four sub-pixels, the four sub-pixels may be arranged side by side horizontally, side by side vertically, or in a shape of a square. However, this embodiment is not limited thereto.

In some examples, the sub-pixel may include a pixel circuit and a light-emitting element electrically connected with the pixel circuit. The pixel circuit may include multiple transistors and at least one capacitor. For example, the pixel circuit may be of a 3T1C (i.e., three transistors and one capacitor) structure, a 7T1C (i.e., seven transistors and one capacitor) structure, a 5T1C (i.e., five transistors and one capacitor) structure, an 8T1C (i.e., eight transistors and one capacitor) structure, or an 8T2C (i.e., eight transistors and two capacitors) structure, or the like.

In some examples, the light-emitting element may be any of a Light Emitting Diode (LED, Light Emitting Diode), an Organic Light Emitting Diode (OLED, Organic Light Emitting Diode), a quantum dot Light Emitting Diode (QLED, Quantum Dot Light Emitting Diodes), a micro LED (including: mini-LED or micro-LED), and the like. For example, the light-emitting element may be an OLED, and the light-emitting element may emit red light, green light, blue light, or white light, etc. under driving of its corresponding pixel circuit. A color of light emitted from the light emitting element may be determined as required. In some examples, the light emitting element may include an anode, a cathode, and an organic emitting layer located between the anode and the cathode. The anode of the light emitting element may be electrically connected with a corresponding pixel circuit. However, this embodiment is not limited thereto.

Figure 2:
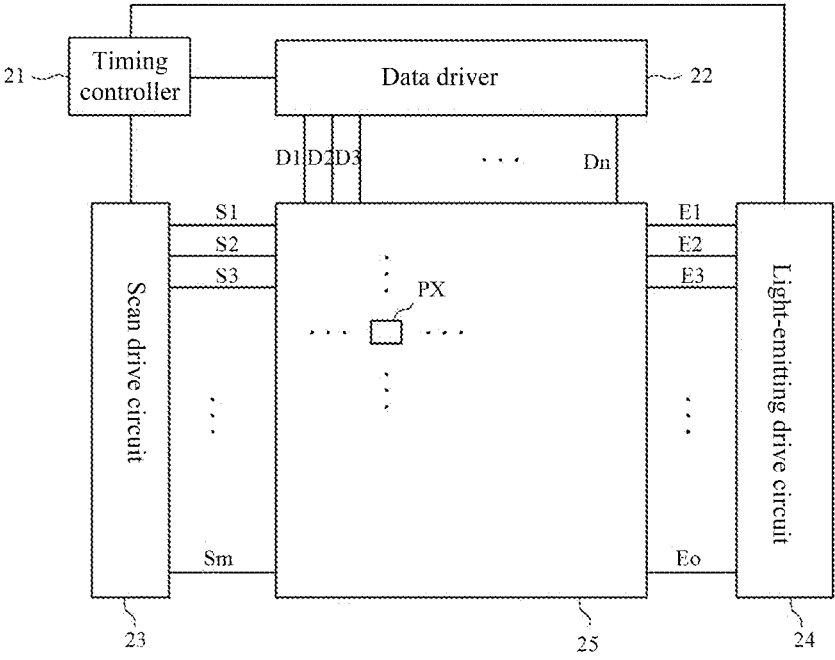
FIG. 2 is a schematic diagram of a structure of a display apparatus.

FIG. 2 is a schematic diagram of a structure of a display apparatus. In some examples as shown in FIG. 2, the display apparatus may include a timing controller 21, a data driver 22, a scan drive circuit 23, a light-emitting drive circuit 24, and a display substrate 25. In some examples, the display area of the display substrate 25 may include multiple sub-pixels PX arranged regularly. The scan drive circuit 23 may be configured to provide a scan signal to a sub-pixel PX along a scan line; the data driver 22 may be configured to provide a data voltage to a sub-pixel PX along a data line; the light-emitting drive circuit 24 may be configured to provide a light-emitting signal to a sub-pixel PX along a light-emitting control line; the timing controller 21 may be configured to control the scan drive circuit 23, the light-emitting drive circuit 24, and the data driver 22.

In some examples, the timing controller 21 may provide a gray-scale value and a control signal suitable for a specification of the data driver 22 to the data driver 22; the timing controller 21 may provide a scan clock signal, a scan start signal, etc., suitable for a specification of the scan drive circuit 23 to the scan drive circuit 23; the timing controller 21 may provide a light-emitting clock signal, a light-emitting start signal, etc., suitable for a specification of the light-emitting drive circuit 24 to the light-emitting drive circuit 24. The data driver 22 may generate a data voltage, which will be provided to data lines D1 to Dn, using the gray-scale value and the control signal received from the timing controller 21. For example, the data driver 22 may sample the gray-scale value using the clock signal and apply the data voltage corresponding to the gray-scale value to the data lines D1 to Dn taking sub-pixel row as the unit. The scan drive circuit 23 may receive the scan clock signal, the scan start signal, etc., from the timing controller 21 to generate a scan signal to be provided for scan lines S1 to Sm. For example, the scan drive circuit 23 may sequentially provide scan signals with on-level pulses to a scan line. In some examples, the scan drive circuit 23 may include a shift register and may generate a scan signal by means of sequentially transmitting a scan start signal provided in a form of an on-level pulse to a next-stage circuit under control of a scan clock signal. The light-emitting drive circuit 24 may receive the light-emitting clock signal, the light-emitting start signal, etc., from the timing controller 21 to generate a light-emitting control signal to be provided to the light-emitting control lines E1 to Eo. For example, the light-emitting drive circuit 24 may provide sequentially light-emitting start signals with off-level pulses to the light-emitting control lines. The light-emitting drive circuit 24 may include a shift register, and generate a light-emitting control signal by means of sequentially transmitting a light-emitting start signal provided in a form of an off-level pulse to a next-stage circuit under control of a light-emitting clock signal. Among them, n, m, and o are all natural numbers.

In some examples, the scan drive circuit and the light-emitting drive circuit may be directly disposed on the display substrate. For example, the scan drive circuit may be provided on the third frame of the display substrate, and the light-emitting drive circuit may be provided on the fourth frame of the display substrate; or, both the third frame and the fourth frame of the display substrate may be provided with a scan drive circuit and a light-emitting drive circuit. In some examples, the scan drive circuit and the light-emitting drive circuit may be formed together with the sub-pixels in a process of forming the sub-pixels.

In some examples, the data driver may be arranged on an independent chip or printed circuit board to be connected with the sub-pixel through the signal access pin on the display substrate. For example, the data driver may be formed and arranged in the first frame of the display substrate using a chip on glass, a chip on plastics, a chip on film, etc., to be connected with the signal access pin. The timing controller may be disposed separately or integrally with the data driver. However, this embodiment is not limited thereto. In some examples, the data driver may be directly disposed on the display substrate.

Figures 3, 4:
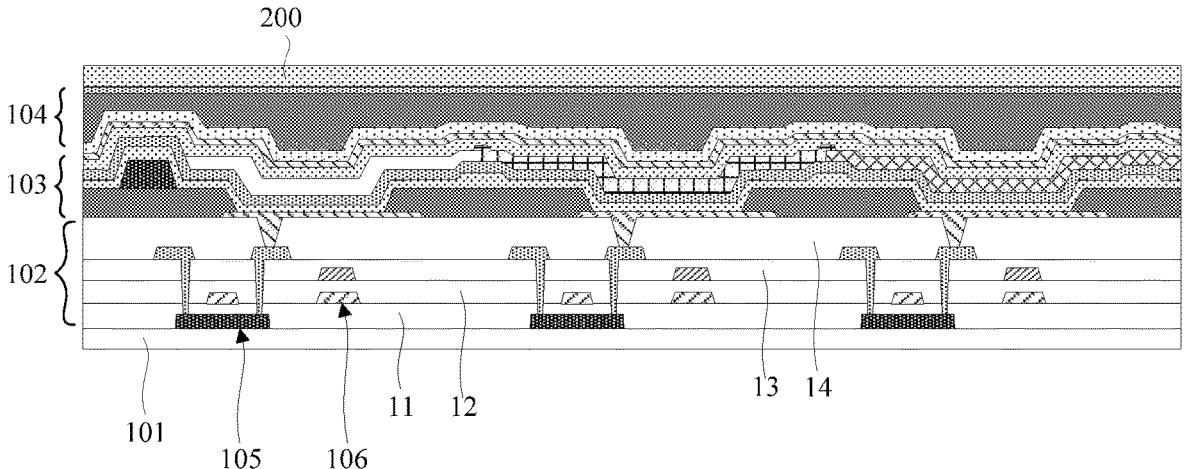
FIG. 3 is a schematic diagram of a partial cross-sectional structure of a display area of a display substrate.
FIG. 4 is an equivalent circuit diagram of a pixel circuit.

FIG. 3 is a schematic diagram of a partial cross-sectional structure of a display area of a display substrate. FIG. 3 illustrates a structure of three sub-pixels of the display substrate. In some examples as shown in FIG. 3, in a direction perpendicular to the display substrate, the display substrate may include a base substrate 101, and a circuit structure layer 102, a light-emitting structure layer 103, an encapsulation structure layer 104, and an encapsulation cover plate 200 which are sequentially disposed on the base substrate 101. In some possible implementations, the display substrate may include another film layer, such as a post spacer, which is not limited in the present disclosure.

In some examples, the base substrate 101 may be a rigid base substrate, e.g., a glass base substrate. However, this embodiment is not limited thereto. For example, the base substrate may be a flexible base substrate, e.g., prepared from an insulation material like a resin. In addition, the base substrate may be a single-layer structure or a multilayer structure. When the base substrate is a multilayer structure, an inorganic material such as silicon nitride, silicon oxide, and silicon oxynitride may be arranged between multiple layers as one or more layers.

In some examples, the circuit structure layer 102 of each sub-pixel may include multiple transistors and a storage capacitor which form a pixel circuit. Illustration is made in FIG. 3 by taking each sub-pixel including a transistor and a storage capacitor as an example. In some possible implementations, the circuit structure layer 102 of each sub-pixel may include: an active layer disposed on the base substrate 101; a first insulation layer 11 covering the active layer; a first gate metal layer (e.g., including a gate electrode and a first capacitance electrode) disposed on the first insulation layer 11; a second insulation layer 12 covering the first gate metal layer; a second gate metal layer (e.g., including a second capacitance electrode) disposed on the second insulation layer 12; a third insulation layer 13 covering the second gate metal layer, the first insulation layer 11, the second insulation layer 12, and the third insulation layer 13 being provided with a via exposing the active layer; a first source-drain metal layer (e.g., including a source electrode and a drain electrode of a transistor) disposed on the third insulation layer 13, and the source electrode and the drain electrode connected respectively to the active layer through a via; and a first planarization layer 14 covering an aforementioned structure, the first planarization layer 14 being provided with a via exposing a drain electrode. The active layer, the gate electrode, the source electrode, and the drain electrode may form the transistor 105, and the first capacitance electrode and the second capacitance electrode may form the storage capacitor 106.

In some examples, the light-emitting structure layer 103 may include an anode layer, a pixel definition layer, an organic light-emitting layer, and a cathode. The anode layer may include the anode of a light-emitting element, the anode may be disposed on the planarization layer, and is connected with the drain electrode of the transistor of the pixel circuit through the vias provided on the planarization layer; the pixel definition layer is disposed on the anode layer and the planarization layer, and a pixel opening is provided on the pixel definition layer and exposes the anode; the organic light-emitting layer is at least partially disposed in the pixel opening and is connected with the anode; the cathode is disposed on the organic light-emitting layer and is connected with the organic light-emitting layer; and the organic light-emitting layer emits light of a corresponding color under driving of the anode and the cathode.

In some examples, the encapsulation structure layer 104 may include a first encapsulation layer, a second encapsulation layer, and a third encapsulation layer that are stacked, the first encapsulation layer and the third encapsulation layer may be made of an inorganic material, the second encapsulation layer may be made of an organic material, and the second encapsulation layer is disposed between the first encapsulation layer and the third encapsulation layer to ensure that external water vapor cannot enter the light emitting structure layer 103.

In some examples, the organic light-emitting layer may at least include a hole injection layer, a hole transport layer, a light-emitting layer and a hole block layer which are stacked on the anode. In some examples, the hole injection layers of all sub-pixels may be a common layer connected together; the hole transport layers of all sub-pixels may be a common layer connected together; the light-emitting layers of adjacent sub-pixels may be slightly overlapped or isolated; and the hole block layers may be a common layer connected together. However, this embodiment is not limited thereto.

FIG. 4 is an equivalent circuit diagram of a pixel circuit. In some examples as shown in FIG. 4, the pixel circuit of this example may include seven transistors (i.e., a first transistor T1 to a seventh transistor T7) and a storage capacitor Cst. Among them, a gate electrode of the third transistor T3 is electrically connected with a first node N1, a first electrode of the third transistor T3 is electrically connected with a second node N2, and a second electrode of the third transistor T3 is electrically connected with the third node N3. The third transistor T3 may also be referred to as a drive transistor. A gate electrode of the fourth transistor T4 is electrically connected with the first scan signal line GL, a first electrode of the fourth transistor T4 is electrically connected with the data line DL, and a second electrode of the fourth transistor T4 is electrically connected with the first electrode of the third transistor T3. The fourth transistor T4 may also be referred to as a data writing transistor. A gate of a second transistor T2 is electrically connected with a first scan line GL, a first electrode of the second transistor T2 is electrically connected with a gate electrode of the third transistor T3, and a second electrode of the second transistor T2 is electrically connected with a second electrode of the third transistor T3. The second transistor T2 may also be referred to as a threshold compensation transistor. A gate electrode of a fifth transistor T5 is electrically connected with a light-emitting control line EML, a first electrode of the fifth transistor T5 is electrically connected with a second power supply line VDD, and a second electrode of the fifth transistor T5 is electrically connected with the first electrode of the third transistor T3. A gate electrode of a sixth transistor T6 is electrically connected with the light-emitting control line EML, a first electrode of the sixth transistor T6 is electrically connected with the second electrode of the third transistor T3, and a second electrode of the sixth transistor T6 is electrically connected with an anode of the light-emitting element EL. The fifth transistor T5 and the sixth transistor T6 may be referred to as light-emitting control transistors. A first transistor T1 is electrically connected with the gate electrode of the third transistor T3 and configured to reset the gate electrode of the third transistor T3, and a seventh transistor T7 is electrically connected with the anode of the light-emitting element EL and configured to reset the anode of the light-emitting element EL. A gate electrode of the first transistor T1 is electrically connected with a second scan line RST1, a first electrode of the first transistor T1 is electrically connected with a first initial signal line INIT1, and a second electrode of the first transistor T1 is electrically connected with the gate electrode of the third transistor T3. A gate electrode of the seventh transistor T7 is electrically connected with a third scan line RST2, a first electrode of the seventh transistor T7 is electrically connected with a second initial signal line INIT2, and a second electrode of the seventh transistor T7 is electrically connected with the anode of the light-emitting element EL. The first transistor T1 and the seventh transistor T7 may also be referred to as reset control transistors. A first capacitance electrode plate of a storage capacitor Cst is electrically connected with a gate electrode of the third transistor T3, and a second capacitance electrode plate of the storage capacitor Cst is electrically connected with the second power supply line VDD.

In this example, the first node N1 is a connection point of the storage capacitor Cst, the first transistor T1, the third transistor T3, and the second transistor T2, the second node N2 is a connection point of the fifth transistor T5, the fourth transistor T4, and the third transistor T3, the third node N3 is a connection point of the third transistor T3, the second transistor T2, and the sixth transistor T6, and the fourth node N4 is a connection point of the sixth transistor T6, the seventh transistor T7, and the light-emitting element EL.

In some examples, the first transistor T1 to the seventh transistor T7 may be P-type transistors or may be N-type transistors. Use of a same type of transistors in a pixel drive circuit may simplify a process flow, reduce process difficulties of a display panel, and improve a product yield. In some possible implementations, the first transistor T1 to the seventh transistor T7 may include P-type transistors and N-type transistors.

In some examples, the second power supply line VDD may be configured to provide a constant second voltage signal VDD for a pixel circuit, the first power supply line VSS may be configured to provide a constant first voltage signal to a pixel circuit, and a second voltage signal VDD is greater than a first voltage signal. The first scan line GL may be configured to provide a scan signal SCAN to the pixel circuit, the data line DL may be configured to provide a data signal DATA to the pixel circuit, the light-emitting control line EML may be configured to provide a light-emitting control signal EM to the pixel circuit, the second scan line RST1 may be configured to provide a first reset control signal RESET1 to the pixel circuit, and the third scan line RST2 may be configured to provide a second reset control signal RESET2 to the pixel circuit. In some examples, the second scan line RST1 electrically connected to a $n^{th}$ row of the pixel circuit may be electrically connected with the first scan line GL of a $(n-1)^{th}$ row of the pixel circuit, to be inputted with a scan signal SCAN(n−1), that is, a first reset control signal RESET1(n) may be the same as a scan signal SCAN(n−1). A third scan line RST2 of the $n^{th}$ row of the pixel circuit may be electrically connected with a first scan line GL of the $n^{th}$ row of the pixel circuit, to be inputted with a scan signal SCAN(n), that is, a second reset control signal RESET2(n) may be the same as a scan signal SCAN(n). Herein, n is an integer greater than 0. Thus, signal lines of the display substrate may be reduced, and a design of a narrow frame of the display substrate may be achieved. However, this embodiment is not limited thereto.

In some examples, the first initial signal line INIT1 is configured to provide a first initial signal to the pixel circuit, and the second initial signal line INIT2 is configured to provide a second initial signal to the pixel circuit. For example, the first initial signal may be different from the second initial signal. The first initial signal and the second initial signal may be constant voltage signals, and their magnitudes may be between a first voltage signal and a second voltage signal, but not limited to this. In other examples, the first initial signal and the second initial signal may be the same and only the first initial signal line may be disposed to provide the first initial signal.

In some implementations, the display substrate can be encapsulated by Frit, that is, an encapsulation adhesive (glass powder) encapsulation manner. After the circuit structure layer, the light-emitting structure layer and the encapsulation structure layer are sequentially formed on the base substrate, the encapsulation cover plate can be covered on the encapsulation structure layer by a Frit encapsulation process. For example, the Frit encapsulation process of the display substrate can be as follows, for example: coating encapsulation adhesive on the encapsulation region of the base substrate by dispensing or printing process, and aligning and attaching the base substrate and the encapsulation cover plate together; subsequently, the encapsulation adhesive is melted by laser, and the base substrate and the encapsulation cover plate are combined together. A single display substrate can be obtained by cutting the display motherboard formed by attaching the base substrate and the encapsulation cover plate. The Frit encapsulation process can prevent air and water vapor from entering the display substrate. However, in the process of encapsulation adhesive printing or in the process of post-printing laser sintering, due to design or insufficient process margin, it is easy to cause the offset of the encapsulation adhesive, change the offset and width of the encapsulation adhesive, and cause the signal lead line in the nearby metal film layer to melt, resulting in short circuit between the signal lead line and the encapsulation adhesive base substrate (Frit sub), which will cause abnormal display of the whole display substrate.

The embodiment provides a display substrate, and the display substrate includes a base substrate, a first encapsulation adhesive base substrate, multiple first signal lead lines, multiple test connection traces and multiple test signal access pins. The base substrate at least includes a display area and a peripheral area located at a side of the display area. The first encapsulation adhesive base substrate is located in the peripheral area. The multiple first signal lead lines, the multiple test connection traces and the multiple test signal access pins are located on a side of the first encapsulation adhesive base substrate away from the display area. At least one first signal lead line is electrically connected with at least one test signal access pin through at least one test connection trace. Orthographic projections of the connection positions of the first signal lead lines and the test connection traces on the base substrate are not overlapped with an orthographic projection of the first encapsulation adhesive base substrate on the base substrate. In some examples, the base substrate may be a glass base substrate and the encapsulation cover plate may be a glass cover plate.

The display substrate provided by this embodiment, by disposing a connection position of the test connection trace and the first signal lead line away from the first encapsulation adhesive base substrate, it can be ensured that a sufficient distance is kept between the connection position of the test connection trace and the first signal lead line and the first encapsulation adhesive base substrate to avoid wire short circuit, electrochemical corrosion, or burnt the test connection trace due to the close distance between the two. This embodiment can improve the high temperature and high humidity reliability of the display substrate and reduce the yield loss.

In some exemplary implementations, the display substrate may further include an encapsulation cover plate disposed on the base substrate, and a connection position of the first signal lead line and the test connection trace may be away from the encapsulation cover plate. For example, the orthographic projections of the connection positions of the first signal lead lines and the test connection traces on the base substrate may be not overlapped with an orthographic projection of the encapsulation cover plate on the base substrate. The orthographic projection of the first encapsulation adhesive base substrate on the base substrate may be overlapped with the orthographic projection of the encapsulation cover plate on the base substrate. In some examples, the connection positions of the first signal lead lines and the test connection traces may be located on a side of the first cutting path for the encapsulation cover plate away from the first encapsulation adhesive base substrate. The encapsulation cover plate in a side of an area of the first cutting path away from the first encapsulation adhesive base substrate can be cut off. In this example, the test signal access pin is not removed during the cutting process, and the test signal access pin can remain in the display substrate. The display substrate provided in this example, by disposing the connection position of the test connection trace and the first signal lead line on a side of the first cutting path away from the first encapsulation adhesive base substrate, it can be ensured that a sufficient distance is kept between the connection position of the test connection trace and the first signal lead line and the first encapsulation adhesive base substrate to avoid wire short circuit, electrochemical corrosion, or burnt the test connection trace due to the close distance between the two. This embodiment can improve the high temperature and high humidity reliability of the display substrate and reduce the yield loss.

In some exemplary implementations, the peripheral area may include at least one test signal access region located on a side of the display area, and a first area located between the display area and a test signal access region. The multiple test signal access pins may be located in the test signal access region, and the first encapsulation adhesive base substrate, the multiple first signal lead lines and the multiple test connection traces can be located at least in the first area. For example, the multiple first signal lead lines and the multiple test connection traces may all be located in the first area; as another example, portions of the multiple first signal lead lines and the multiple test connection traces may extend out of the first area to a side away from the display area. However, this embodiment is not limited thereto.

In some exemplary implementations, the display substrate may further include a first organic insulation layer disposed on the base substrate. An orthographic projection of the first organic insulation layer on the base substrate can cover the connection position of the first signal lead line and the test connection trace. In some examples, the first organic insulation layer may be referred to as a first planarization layer. By disposing the first organic insulation layer to cover the connection position of the first signal lead line and the test connection line, the connection position can be protected, and the situation of electrochemical corrosion or the test connection trace being burned and the like can be improved, thereby improving the high temperature and high humidity reliability of the display substrate and reducing the yield loss.

In some exemplary implementations, a distance between an edge of the first organic insulation layer close to the display area and an edge of the first encapsulation adhesive base substrate on a side away from the display area may be greater than or equal to 50 microns. For example, a distance between an edge of the first organic insulation layer close to the display area and an edge of the first encapsulation adhesive base substrate on a side away from the display area may be greater than or equal to 120 microns. In this example, the first organic insulation layer covers the connection position of the first signal lead line and the test connection line, by increasing the distance between an edge of the first organic insulation layer close to the display area and an edge of the first encapsulation adhesive base substrate away from the display area, a trace short circuit between the aforementioned connection position and the first encapsulation adhesive base substrate due to the distance being too close can be avoided, thereby reducing the yield loss.

In some exemplary implementations, the multiple first signal lead lines may be configured to transmit at least one of the following signals: a scan start signal, a scan clock signal, a light-emitting start signal, a light-emitting clock signal, a drive power supply signal, a test data signal, and a test control signal. For example, the multiple first signal lead lines transmitting a scan start signal, a scan clock signal, and a drive power supply signal may be electrically connected with the scan drive circuit. The multiple first signal lead lines transmitting a light-emitting start signal, a light-emitting clock signal and a drive power supply signal may be electrically connected with the light-emitting drive circuit. The multiple first signal lead lines transmitting the test data signal and the test control signal may be electrically connected with the test circuit.

In some exemplary implementations, in a direction perpendicular to the display substrate, the first encapsulation adhesive base substrate and the multiple test connection traces may be located on a side of the multiple first signal lead lines away from the base substrate. For example, the first encapsulation adhesive base substrate and the multiple test connection traces may be of a same layer structure. For example, the first encapsulation adhesive base substrate and the multiple test connection traces may be located in a first source-drain metal layer. Multiple first signal lead lines may be located in a first gate metal layer. However, this embodiment is not limited thereto.

Figure 5:
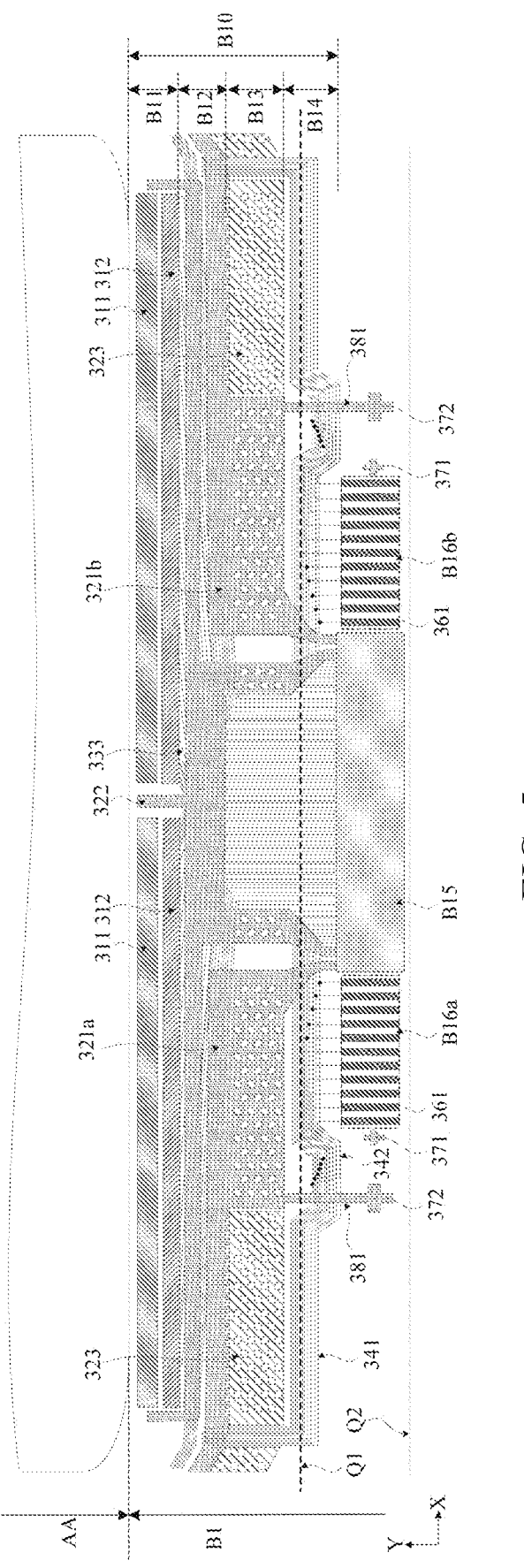
FIG. 5 is a schematic diagram of a first frame of a display substrate according to at least one embodiment of the present disclosure.

FIG. 5 is a schematic diagram of a first frame of a display substrate according to at least one embodiment of the present disclosure. In some examples as shown in FIG. 5, the first frame (lower frame) B1 of the display substrate may at least include a signal access region B15 and two test signal access regions (e.g. a first test signal access region B16*a* and a second test signal access region B16*b*) located on a side of the display area AA, and a first area B10 located between the signal access region B15 and the display area AA. The signal access region B15 and the two test signal access regions may be adjacent in the first direction X. For example, the two test signal access regions may be located on opposite sides of the signal access region B15 in the first direction X. For example, the first test signal access region B16*a* may be located on a left side of the signal access region B15 in the first direction X, and the second test signal access region B16*b* may be located on a right side of the signal access region B15 in the first direction X. However, this embodiment is not limited thereto. In other examples, only one test signal access region adjacent to the signal access region may be provided.

In some examples as shown in FIG. 5, the first area B10 may include a peripheral circuit region B11, a fan-out trace region B12, an encapsulation region B13, and a test trace region B14 sequentially arranged in a direction away from the display area AA in the second direction Y. The signal access region B15, the first test signal access region B16*a*, and the second test signal access region B16*b* may be located on a side of the test trace region B14 away from the encapsulation region B13. The encapsulation region B13 may be an area where an encapsulation adhesive is coated or printed. In some examples, the encapsulation region B13 may be an annular area surrounding the display area AA, therefore it is beneficial to improve encapsulation effects.

In some examples as shown in FIG. 5, the peripheral circuit region B11 of the first frame B1 may be provided with multiple multiplexer circuits 311 and an electrostatic discharge (ESD) circuit 312. The electrostatic discharge circuit 312 may be located on a side of the multiple multiplexer circuits 311 away from the display area AA. The multiple multiplexer circuits 311 may include multiple multiplexer units, each multiplexer unit may be electrically connected with multiple data lines in the display area AA and may be configured so that a signal source may provide data signals to the multiple data lines. For example, each multiplexer unit may be electrically connected with a multiplexer data line, and a signal source providing a data signal may be electrically connected through the multiplexer data line. The multiplexer data line may be electrically connected with the electrostatic discharge circuit 312 to discharge static electricity.

In some examples as shown in FIG. 5, multiple data fan-out lines 333 may be provided in the fan-out trace region B12. The multiple data fan-out lines 333 may be electrically connected with multiple multiplexer data lines of the peripheral circuit region B11. For example, the multiple data fan-out lines 333 may be electrically connected with the multiple multiplexer data lines in a one to one correspondence. The multiple data fan-out lines may extend to the signal access region B15 and are electrically correspondingly connected with the multiple first signal access pins in the signal access region B15. In some examples, the multiple data fan-out lines 333 may be of a same layer structure, for example may be located in the first gate metal layer.

In some examples as shown in FIG. 5, the first area B10 may also be provided with first power supply lines 321*a* and 321*b* and a second power supply line 322. The first power supply line 321*a* may extend to the third frame and the first power supply line 321*b* may extend to the fourth frame. For example, the first power supply lines 321*a* and 321*b* may be connected within the second frame to form an integral structure. The first power supply lines 321*a* and 321*b* may be configured to be connected with a low potential power supply line to transmit a first voltage signal. The second power supply line 322 may be configured to be connected with a high potential power supply line of the display area AA to transmit a second voltage signal. The first power supply lines 321*a* and 321*b* may be located on opposite sides of the second power supply line 322 in the first direction X. The first power supply lines 321*a* and 321*b* may each extend to the signal access region and be electrically connected with a first power supply access pin of the signal access region, and the second power supply line 322 may extend to the signal access region and be electrically connected with the second power supply access pin of the signal access region. In some examples, the first power supply lines 321*a* and 321*b* and the second power supply line 322 may be of a same layer structure, for example may be located in a first source-drain metal layer. The first power supply lines 321*a* and 321*b* and the second power line 322 and the multiple data fan-out lines 333 may be disposed in different layers. Orthographic projections of the first power supply lines 321*a* and 321*b* on the base substrate may be partially overlapped with orthographic projections of the multiple data fan-out lines 333 on the base substrate, and an orthographic projection of the second power supply line 322 on the base substrate may be partially overlapped with the orthographic projections of the multiple data fan-out lines 333 on the base substrate.

In some examples as shown in FIG. 5, the first power supply lines 321*a* and 321*b* and the second power supply line 322 may extend from the fan-out trace region B12 through the encapsulation region B13 to the test trace region B14. The first power supply lines 321*a* and 321*b* located in the encapsulation region B13 may serve as a first encapsulation adhesive base substrate, and the second power supply line 322 located in the encapsulation region B13 may serve as a second encapsulation adhesive base substrate. In other words, the first encapsulation adhesive base substrate may be electrically connected with the first power supply lines 321*a* or 321*b* and the second encapsulation adhesive base substrate may be electrically connected with the second power supply line 322. The first encapsulation adhesive base substrate and the second encapsulation adhesive base substrate may be provided with multiple openings. By disposing multiple openings on the encapsulation adhesive base substrate, when an encapsulation adhesive is coated on the encapsulation adhesive base substrate, the encapsulation adhesive will leak into the openings, which is equivalent to having the encapsulation adhesive on and inside the encapsulation adhesive base substrate. When the encapsulation adhesive is melted by laser, the bonding strength of the encapsulation adhesive may be further improved, and the bonding force between the base substrate and the encapsulation cover plate can be enhanced, thereby improving the product yield.

In some examples as shown in FIG. 5, the first area B10 may also be provided with a first peripheral power supply connection line 323. The first peripheral power supply connection line 323 may be electrically connected with the first power supply line 321*a* or 321*b*. The first peripheral power supply connection line 323 may be located on a side of the first power supply lines 321*a* and 321*b* close to the base substrate, for example may be located on a first gate metal layer. The first peripheral power supply connection line 323 may be provided with multiple vias. The first peripheral power supply connection line 323 may be located on a side of the first power supply line 321*a* or 321*b* away from the second power supply line 322 in the first direction X. Taking the first peripheral power supply connection line 323 is electrically connected with the first power supply line 321*a* as an example, the first peripheral power supply connection line 323 and the first power supply line 321*a* are adjacent in the second direction Y, the first peripheral power supply connection line 323 has multiple first protrusions at an edge close to the first power supply line 321*a* in the second direction Y, the first power supply line 321*a* has multiple second protrusions at an edge close to the first peripheral power supply connection line 323 in the second direction Y, and the multiple second protrusions may be electrically connected with the multiple first protrusions in a one to one correspondence to realize an electrical connection between the first peripheral power supply connection line 323 and the first power supply line 321*a*. In some examples, by increasing a length of the first peripheral power supply connection line 323 in the first direction X, a length of the first power supply line 321*a* along the first direction X may be reduced. By reducing the length of the first power supply line along the first direction, the situation that the first encapsulation adhesive base substrate is easy to corrode or crack under a high temperature and high humidity environment can be improved, thereby improving the product yield.

In some examples as shown in FIG. 5, the test trace region B14 may be disposed with multiple first signal lead lines 341 and multiple test connection traces 342. The multiple first signal lead lines 341 may extend in the first direction X in the test track region B14 and may also extend toward a side of the display area AA along the second direction Y. For example, the multiple first signal lead lines 341 may be electrically connected with the multiple signal connection lines in the fan-out trace region B12 to further extend to the third frame and the fourth frame. The multiple first signal lead lines 341 may extend to the signal access region B15 and are electrically connected with the multiple signal access pins in the signal access region B15. The multiple first signal lead lines 341 may be of a same layer structure, for example may be located in the first gate metal layer. The multiple first signal lead lines 341 may also be electrically connected with the multiple test signal access pins 361 in the test signal access region B16a or B16b through the multiple test connection traces 342. For example, the multiple first signal lead lines 341 may be electrically connected with the multiple test connection traces 342 in a one to one correspondence. The multiple test connection traces 342 may be located on a side of the multiple first signal lead lines 341 away from the base substrate, for example may be located in the first source-drain metal layer.

Figures 7, 8:
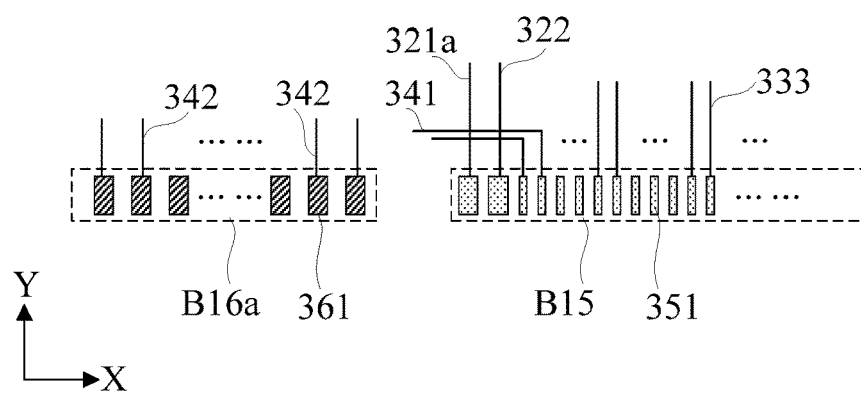
FIG. 7 is a partial schematic diagram of a signal access region and a test signal access region according to at least one embodiment of the present disclosure.
FIG. 8 is an exemplary trace diagram of a peripheral area according to at least one embodiment of the present disclosure.

FIG. 7 is a partial schematic diagram of a signal access region and a test signal access region according to at least one embodiment of the present disclosure. In some examples as shown in FIG. 7, the signal access region B15 may include multiple signal access pins 351 arranged side by side in parallel, and the multiple signal access pins 351 may be sequentially arranged along the first direction X. The multiple signal access pins 351 may be configured to form bonding connections with a flexible circuit board or a drive chip, thereby acquiring signals from the flexible circuit board or the drive chip. The multiple signal access pins 351 may include multiple first power supply access pins, multiple second power supply access pins, and multiple first signal access pins. The first power supply access pin may be electrically connected with the first power supply line 321a or 321b, the second power supply access pin may be electrically connected with the second power supply line 322, at least a part of the first signal access pins may be electrically connected with the multiple data fan-out lines 333, and at least a part of the first signal access pins may be electrically connected with the multiple first signal lead lines 341. In some examples, the first power supply access pins and the second power supply access pins may be located on two opposite sides of the multiple first signal access pins in the first direction X. The first power supply access pin may be adjacent to the test signal access region B16a or B16b. In some examples, a length of the first power supply access pin and the second power supply access pin along the first direction X may be greater than a length of the first signal access pin along the first direction X, and lengths of the first power supply access pin, the second power supply access pin, and the first signal access pin along the second direction Y may be the same. In some examples, a size of the first power supply access pin and the second power supply access pin is larger than a size of the first signal access pin. However, this embodiment is not limited thereto.

In some examples as shown in FIG. 7, take the first test signal access region B16a as an example for illustration. Multiple test signal access pins 361 are disposed abreast in parallel in the first test signal access region B16a. The multiple test signal access pins 361 are sequentially arranged in the first direction X. The multiple test signal access pins 361 may be disposed in parallel with the multiple signal access pins 351 in the signal access area B15. The multiple test signal access pins 361 may be configured to contact with the test probe of the testing device (e.g., a flexible circuit board) in the ET (abbreviated from, Electronic Test) process, thereby obtaining signals from the test probe. In some examples, a test signal access pin 361 of the first test signal access area B16a may be electrically connected with a test circuit and a scan drive circuit of the frame area through the test connection trace 342 and the first signal lead line 341, and is configured to provide a test signal for the test circuit and the scan drive circuit. However, this embodiment is not limited thereto.

In some examples as shown in FIG. 7, lengths of the multiple test signal access pins 361 along the first direction X may be substantially the same, and lengths of the multiple test signal access pins 361 in the second direction Y may be substantially the same. Dimensions of the multiple test signal access pins 361 may be substantially the same. However, this embodiment is not limited thereto.

In some examples as shown in FIG. 5, the multiple test signal access pins 361 of the second test signal access region B16b may be electrically connected with the test circuit and a light-emitting drive circuit of the frame area through the test connection trace 342 and the first signal lead line 341, and are configured to provide the test signal to the test circuit and the light-emitting drive circuit. The configuration of the test signal access pins of the second test signal access region B16b can be described with reference to the first test signal access region B16a, and will not be repeated here.

In some examples, the first voltage signal and the second voltage signal may be provided to the display substrate through a first power supply access pin and a second power supply access pin (i.e., a pin connecting the first power supply line and the second power supply line) of the signal access region B15 during the electronic test. In this example, during the electronic test, the first power supply access pin of the signal access region B15 can be used to provide the first voltage signal, and the second power supply access pin of the signal access region B15 can be used to provide the second voltage signal. However, this embodiment is not limited thereto. For example, at least part of the test signal access pins may be disposed to be electrically connected with the first power supply line and the second power supply line.

FIG. 8 is an exemplary trace diagram of a peripheral area according to at least one embodiment of the present disclosure. In some examples as shown in FIG. 8, the second frame B1 of the display substrate may be disposed with the test circuit 313, the third frame B3 may be disposed with the scan drive circuit 23, and the fourth frame B4 may be disposed with the light-emitting drive circuit 24. In the process of the electronic test, the multiple test signal access pins in the first test signal access region B16a of the first frame B1 may supply a scan start signal (GSTV), a scan clock signal and a drive power supply signal to the scan drive circuit 23 through multiple first signal lead lines 341 extending to the third frame B3, and a test data signal and a test control signal may also be supplied to the test circuit 313 through the multiple first signal lead lines 341. In the process of the electronic test, the multiple test signal access pins in the second test signal access region B16b of the first frame B1 may supply a light-emitting start signal (ESV), a light-emitting clock signal and a drive power supply signal to the light-emitting drive circuit 24 through the multiple first signal lead lines 341 extending to the fourth frame B4, and the test data signal and the test control signal may also be supplied to the test circuit 313 through the multiple first signal lead lines 341. The multiple first signal lead lines 341 may be electrically connected with the test circuit 313 in the second frame B2 via the third frame B3 or the fourth frame B4. However, this embodiment is not limited thereto. In other examples, the third frame and the fourth frame may both be disposed with a scan drive circuit and a light-emitting drive circuit, and the test signal access pin may provide signals to the scan drive circuit in the third frame and the fourth frame respectively through multiple first signal lead lines, and provide signals to the light-emitting drive circuit in the third frame and the fourth frame respectively.

In some examples, the multiple first signal lead lines 341 may also be electrically connected with signal access pins in the signal access region B15. For example, the multiple first signal lead lines electrically connected to the signal access pins may provide a scan start signal, a scan clock signal, a light-emitting start signal, a light-emitting clock signal, and a drive power supply signal to provide signals to the scan drive circuit and the light-emitting drive circuit during a normal display process.

In some examples as shown in FIG. 5, during the preparation of the display substrate, an encapsulation cover plate may be mounted on the base substrate after the preparation of an encapsulation structure layer, and then cutting may be performed along a second cutting path Q2 to obtain a single display substrate. The position of the second cutting path Q2 may correspond to an edge of the single display substrate after cutting. Cutting along the first cutting path Q1 removes part of the encapsulation cover plate, exposing the signal access pins of the signal access region B15 and the test signal access pins 361 of the two test signal access regions. The exposed signal access pin may be bound and connected with the flexible circuit board or the drive chip. The exposed test signal access pin 361 may be in contact with the test apparatus for the electronic test. The connection position of the first signal lead line 341 and the test connection line 342 may be located on a side of the first cutting path Q1 away from the first encapsulation adhesive base substrate, thereby avoiding a short circuit situation caused by the distance between the test connection line and the first encapsulation adhesive base substrate being too close.

In some examples as shown in FIG. 5, the first test signal access region B16a may be disposed with a first auxiliary mark 371 on a side away from the signal access region B15 in the first direction X. The first auxiliary mark 371 may be disposed with a second auxiliary mark 372 on a side away from the first test signal access region B16a in the first direction X. Similarly, the first auxiliary mark 371 and the second auxiliary mark 372 are also disposed on a side of the second test signal access region B16b away from the signal access region B15. For example, a size of the first auxiliary mark 371 may be smaller than a size of the second auxiliary mark 372. In some examples, an orthographic projection of the first auxiliary mark 371 on the base substrate and an orthographic projection of the second auxiliary mark 372 on the base substrate may be in a shape of a cross. However, this embodiment is not limited thereto. For example, at least one of the first auxiliary mark and the second auxiliary mark may be L-shaped. In this example, by disposing the first auxiliary mark to help align the test probe and the test signal access pin in the test signal access region accurately in the electronic test process. In other examples, only the first auxiliary mark may be disposed when the space of the first frame is limited.

In some examples as shown in FIG. 5, the first auxiliary mark 371 and the second auxiliary mark 372 may be of a same layer structure, for example may be located in the first source-drain metal layer. However, this embodiment is not limited thereto.

In some examples as shown in FIG. 5, the first power supply line 321a may be electrically connected with a second auxiliary mark 372 through a first connection line 381. The second power supply line 321b may be electrically connected with another second auxiliary mark 372 through another first connection line 381. The first connection line 381 may extend along the second direction Y. For example, the first power supply line 321a, the first connection line 381, and the second auxiliary mark 372 may be an integral structure. However, this embodiment is not limited thereto.

Figure 6:
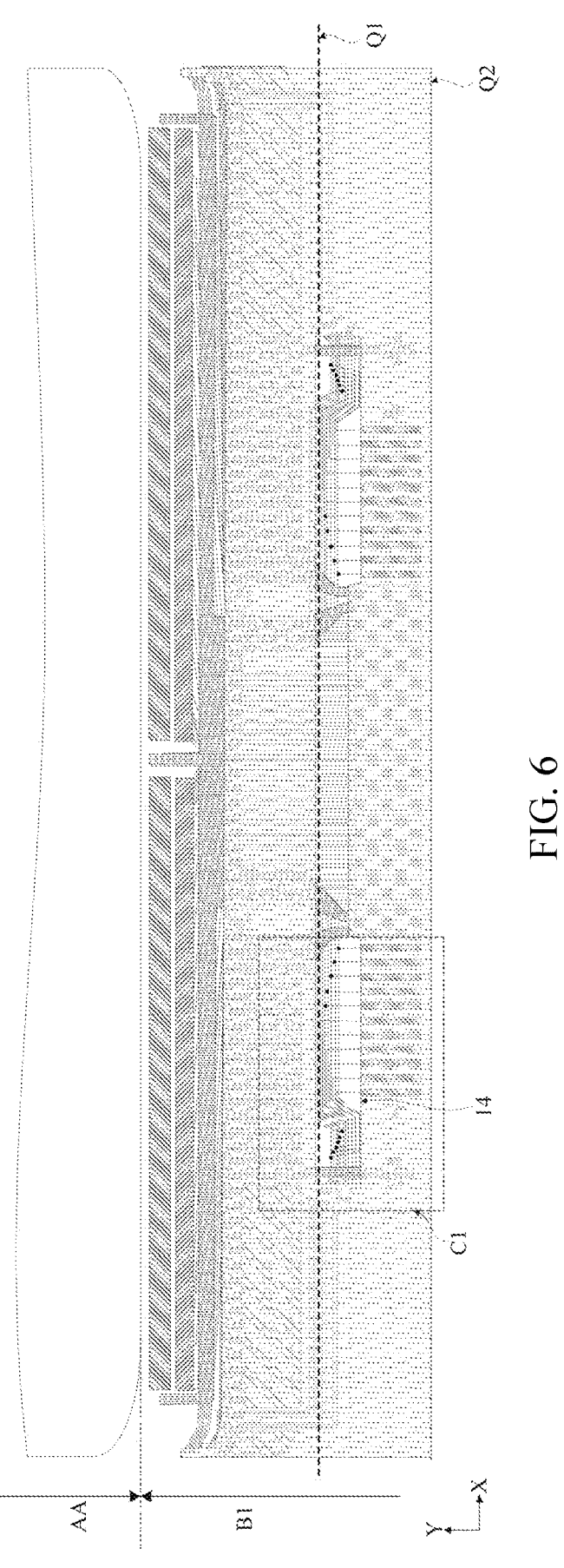
FIG. 6 is a schematic diagram of a first planarization layer of a first frame according to at least one embodiment of the present disclosure.

FIG. 6 is a schematic diagram of a first planarization layer of a first frame according to at least one embodiment of the present disclosure. In some examples as shown in FIG. 6, the first frame B1 may also be disposed with a first planarization layer 14. The first planarization layer 14 of the black dot shaded area in FIG. 6 may be removed to expose the surface of the first source-drain metal layer. The first planarization layer 14 in the peripheral circuit region of the first frame B1 may be retained, and the first planarization layer 14 in a partial area of the test trace region may be retained. An orthographic projection of the first planarization layer 14 retained in the first frame B1 on the base substrate may cover the connection positions of the multiple first signal lead lines 341 and the multiple test connection traces 342.

In some examples as shown in FIG. 6, the distance between an edge of the first planarization layer 14 close to the display area AA and an edge of the first encapsulation adhesive base substrate away from the display area AA may be greater than or equal to 50 microns, for example may be greater than or equal to 120 microns. In some examples, an orthographic projection of the first cutting path Q1 on the base substrate may be overlapped with the first planarization layer 14. The first cutting path Q1 may be located on a side of an edge of the first planarization layer 14 away from the display area AA, the edge is located on a side close to the display area AA. For example, the distance between the first cutting path Q1 and an edge of the first encapsulation adhesive base substrate away from the display area AA may be about 200 microns. However, this embodiment is not limited thereto.

In this example, by disposing the connection position of the first signal lead line 341 and the test connection trace 342 on a side of the first cutting path Q1 away from the display area AA, and the connection position can be covered and protected by the first planarization layer 14, the failure of the trace under the condition of high temperature and high humidity can be avoided, and the display abnormality caused by electrochemical corrosion can be avoided.

Figure 9:
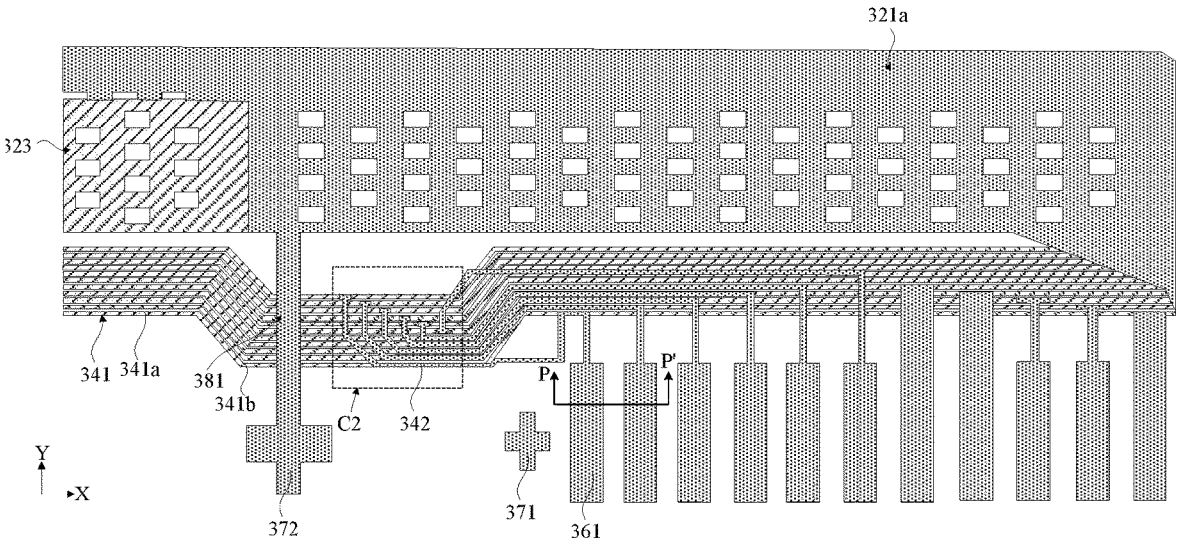
FIG. 9 is a schematic partial enlarged diagram of an area C1 in FIG. 6.
Figure 10:
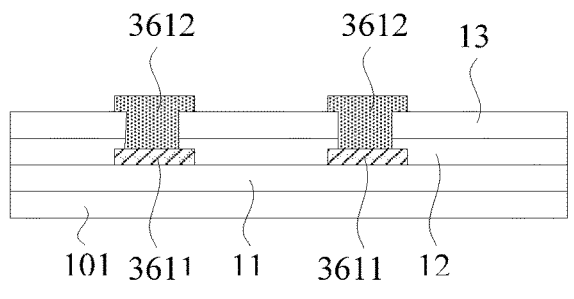
FIG. 10 is a cross-sectional diagram of a part taken along a direction P-P' in FIG. 9.
Figure 11A:
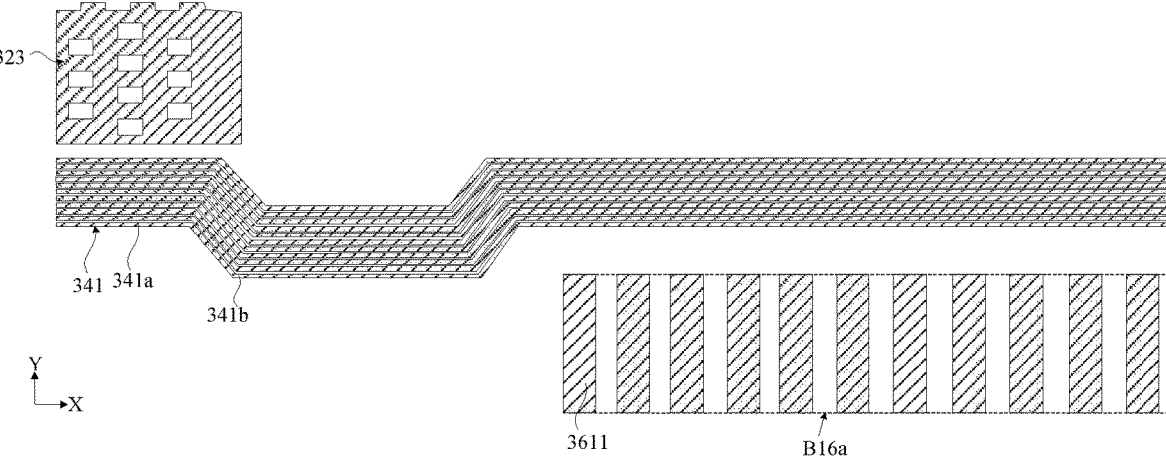
FIG. 11A is a schematic diagram of a first gate metal layer in FIG. 9.
Figure 11B:
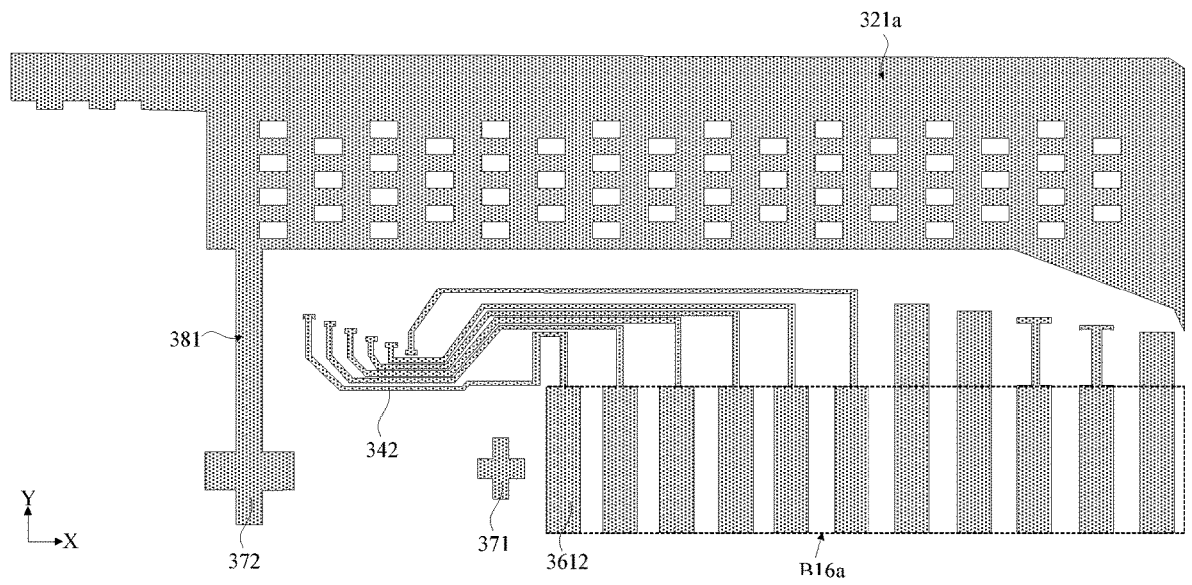
FIG. 11B is a schematic diagram of a source-drain metal layer in FIG. 9.

In some examples, the structures of the left area and the right area of the first frame B1 may be substantially the same and the following example takes the left area of the first frame B1 as an example for illustration. FIG. 9 is a schematic partial enlarged diagram of an area C1 in FIG. 6. FIG. 10 is a cross-sectional diagram of a part taken along a direction P-P' in FIG. 9. FIG. 11A is a schematic diagram of a first gate metal layer in FIG. 9. FIG. 11B is a schematic diagram of a source-drain metal layer in FIG. 9.

In some examples as shown in FIG. 9 and FIG. 11A, the first signal lead line 341 of the test trace region may include a first main body 341a and a first bent portion 341b. The first main body 341a may extend along the first direction X and the first bent portion 341b may protrude along the second direction Y toward a side of the second auxiliary mark 372. The first bent portion 341b may have a first extension part, a second extension part, and a third extension part sequentially connected. The first extension part and the third extension part may both be connected with the first main body 341*a* and the second extension part is connected between the first extension part and the third extension part. The second extension part may extend along the first direction X, and the extension directions of the first extension part and the third extension part may intersect with each other and may intersect with both the first direction X and the second direction Y. The first extension part and the third extension part extend to a side away from the display area AA. An orthographic projection of the first bent portion 341*b* on the base substrate may have a groove shape. In this example, multiple first signal lead lines 341 may all be located in the test trace region. However, this embodiment is not limited thereto. In other examples, the first bent portion 341*b* of at least one first signal lead line 341 may extend to be overlapped with the second auxiliary mark 372, or may extend to an area located on a side of the second auxiliary mark 372 away from the first test signal access region B16*a* in the first direction X.

In some examples as shown in FIG. 9, FIG. 11A and FIG. 11B, the multiple test connection traces 342 may be electrically connected with the multiple first signal lead lines 341 in a one to one correspondence. For example, a portion of the test connection traces 342 may be electrically connected with the first bent portion 341*b* of the corresponding first signal lead line 341, for example may be electrically connected with a second extension part of the first bent portion 341*b*. In some examples, a test signal access pin 361 close to the first auxiliary mark 371 in the first test signal access region B16*a* may be electrically connected with the first signal lead line 341 close to the first encapsulation adhesive base substrate, and a test signal access pin 361 away from the first auxiliary mark 371 may be electrically connected with the first signal lead line 341 away from the first encapsulation adhesive base substrate. The test connection trace 342 electrically connected with the test signal access pin 361 close to the first auxiliary mark 371 may be electrically connected with a first bent portion 341*b* of a corresponding first signal lead line 341. The test connection trace 342 electrically connected with the test signal access pin 361 away from the first auxiliary mark 371 may extend along the second direction Y and then be electrically connected with a first main body 341*a* of the corresponding first signal lead line 341. In this example, the connection positions of the multiple test connection traces 342 and the multiple first signal lead lines 341 may be located on a side of the first connection line 381 close to the first auxiliary mark 371 in the first direction X. However, this embodiment is not limited thereto. In other examples, the connection position of the at least one test connection trace and the at least one first signal lead line may be located on a side of the first connection line 381 away from the first auxiliary mark 371 in the first direction X when the space of the first frame is sufficient.

In some examples as shown in FIG. 10, the test signal access pin 361 may include a first sub-pin 3611 and a second sub-pin 3612. The first sub-pin 3611 and the second sub-pin 3612 may be electrically connected with each other. The first sub-pin 3611 may be located in the first gate metal layer and the second sub-pin 3612 may be located in the first source-drain metal layer. The second sub-pin 3612 may be electrically connected with the first sub-pin 3611 through a groove provided by the third insulation layer 13 and the second insulation layer 12. An orthographic projection of the second sub-pin 3612 on the base substrate 101 may include an orthographic projection of the first sub-pin 3611 on the base substrate 101. The second sub-pin 3612 and the electrically connected corresponding test connection trace 342 may be an integral structure.

Figure 12:
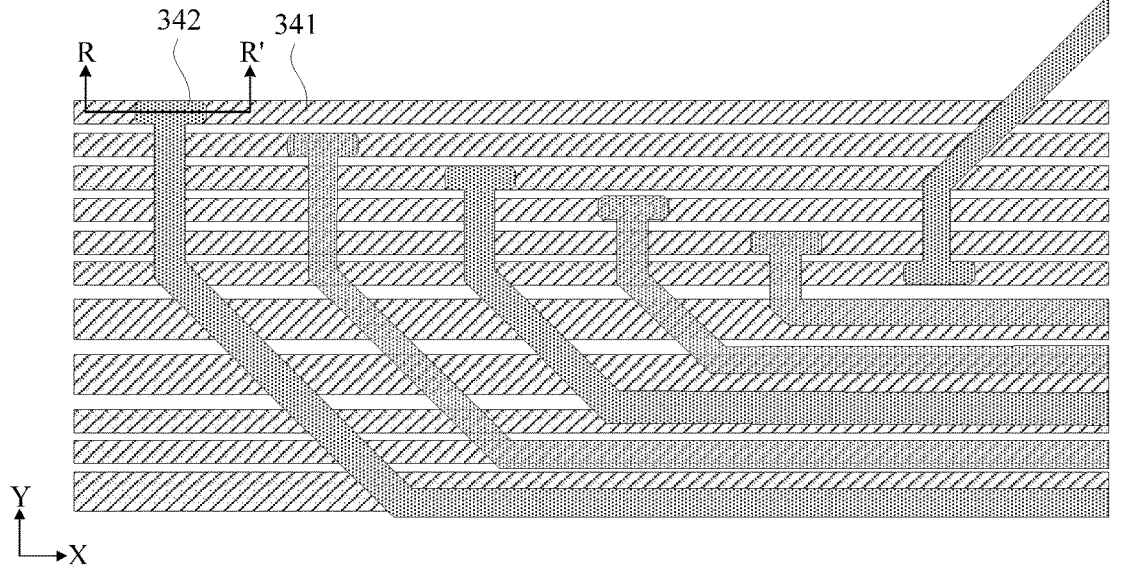
FIG. 12 is a schematic partial enlarged diagram of an area C2 in FIG. 9.
Figure 13:
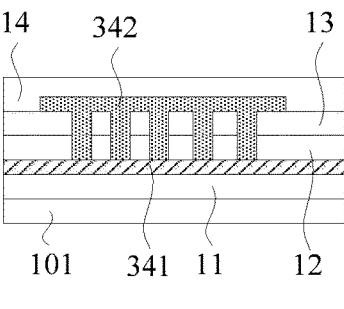
FIG. 13 is a cross-sectional diagram of a part taken along a direction R-R' in FIG. 12.

FIG. 12 is a schematic partial enlarged diagram of an area C2 in FIG. 9. FIG. 13 is a cross-sectional diagram of a part taken along a direction R-R' in FIG. 12. In some examples as shown in FIG. 12 and FIG. 13, the connection end of the test connection trace 342 and the first signal lead line 341 may have a T-shape. At least one test connection trace 342 may extend along the second direction Y to a side away from the display area AA and then along the first direction X until a second sub-pin 3612 of the test signal access pin 361 is connected. The at least one test connection line 342 may extend along the second direction Y to a side close to the display area AA and then along the first direction X until a second sub-pin 3612 of the test signal access pin 361 is connected.

In some examples as shown in FIG. 13, the first signal lead line 341 may be located in the first gate metal layer and the test connection trace 342 may be located in the first source-drain metal layer. However, this embodiment is not limited thereto.

In some examples as shown in FIG. 8, the display substrate may include a Test Circuit (CT) 313. The test circuit (CT) 313 may be located on a side of the display area AA away from the test signal access region. For example, the test circuit 313 may be located in the second frame B2. The test circuit 313 may include multiple test units. Each test unit may be connected with multiple data lines of the display area AA and configured to provide a test data signal to the multiple data lines of the display area AA.

In some examples, the test circuit may include at least one test control signal line, multiple test data lines, and the multiple test units. Each test unit is electrically connected with a test control signal line, a test data line, and multiple data lines of the display area. The test unit may be configured to, according to control of a test control signal line, provide (simultaneously or respectively) signals (test data signals) of a test data line to multiple data lines of a display area connected with it to detect and locate defective subpixels in the display area.

Figures 14, 15A:
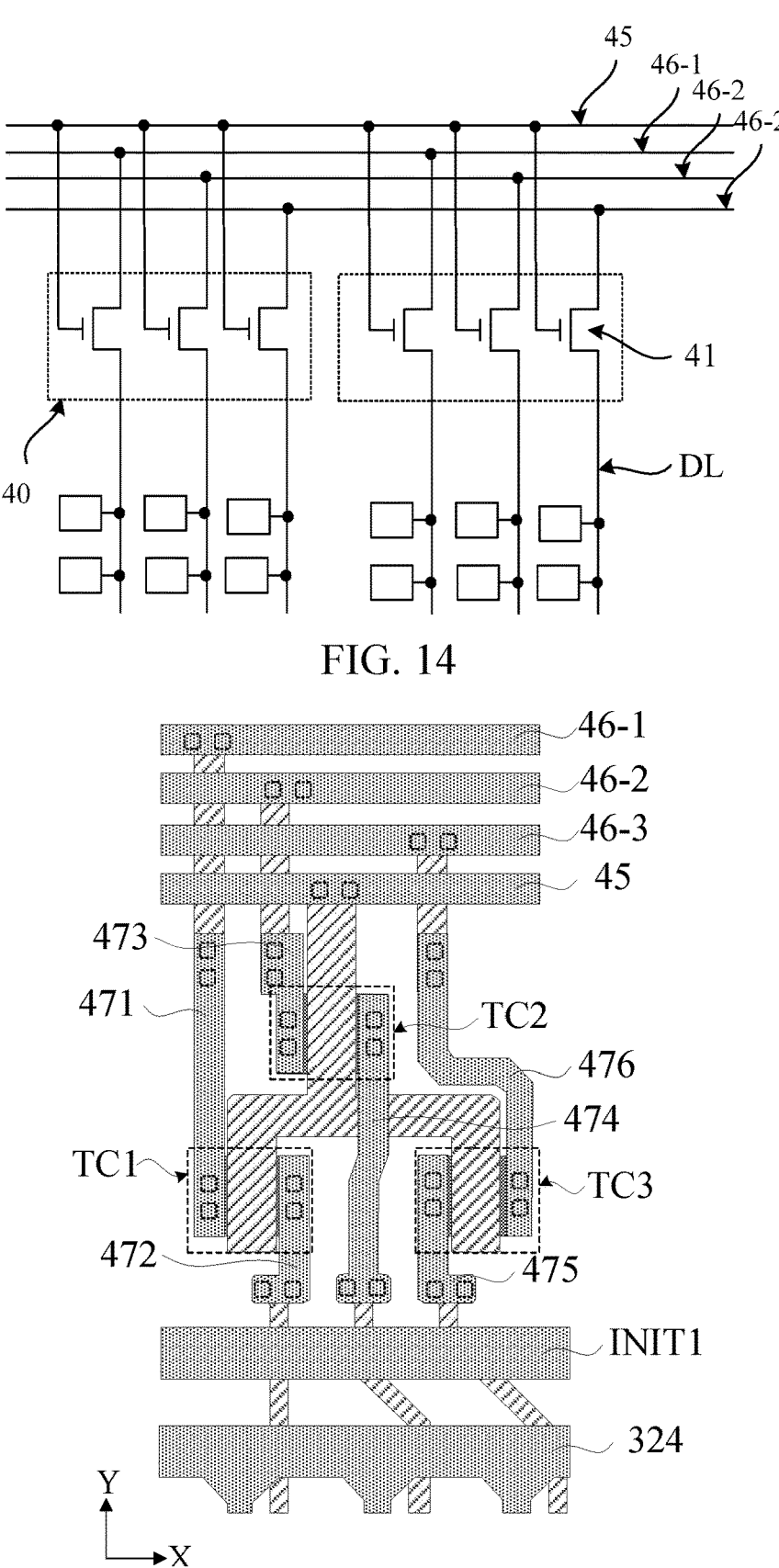
FIG. 14 is an equivalent circuit diagram of a test circuit according to at least one embodiment of the present disclosure.
FIG. 15A is a schematic diagram of a structure of a test unit according to at least one embodiment of the present disclosure.

FIG. 14 is an equivalent circuit diagram of a test circuit according to at least one embodiment of the present disclosure. In some examples, the test circuit may include at least one test control signal line, n1 test data lines and m1 test units; at least one of the m1 test units includes n1 test transistors, and m1 and n1 may be positive integers greater than or equal to 2. FIG. 14 takes a test control signal line, three test data lines and the test unit including three test transistors as an example for illustration. As shown in FIG. 12, among three test transistors 41 of a same test unit 40, the gate electrodes of the three test transistors 41 are all connected with a same test control signal line 45. The first electrodes of the three test transistors 41 are connected with different test data lines, namely, a first electrode of a first test transistor is connected with a first test data line 46-1, a first electrode of a second test transistor is connected with a second test data line 46-2, and a first electrode of a third test transistor is connected with a third test data line 46-3. The second electrodes of the three test transistors 41 are connected with different data lines DL in the display area, namely, a second electrode of the first test transistor is connected with a data line DL, a second electrode of the second test transistor is connected with another data line DL, and a second electrode of the third test transistor is connected with yet another data line DL. In this way, through the test control signal wire 45, the conduction of three test transistors 41 in the test unit 40 can be controlled, and the signals of different test data lines can be controlled to be written into different data lines DL. During the test, the control apparatus provides a conduction signal to the test control signal line 42, and provides the required test data signals to multiple test data lines respectively, so that multiple data lies in the display area can obtain the test data signals to achieve detection. In some examples, a test control signal line and a test data line may be disposed in a frame area, and may be a closed loop trace annularly around the display area.

In some examples, the quantity of data lines may be equal to m1*n1, and the color of the sub-pixels connected with each data line is the same. During the test, a same test data signal is provided to the data lines corresponding to the sub-pixels of a same color, so that these sub-pixels can be displayed in the same way, and determine whether there is a defective sub-pixel through the color of the display image, and locate the defective sub-pixel.

FIG. 15A is a schematic diagram of a structure of a test unit according to at least one embodiment of the present disclosure. FIG. 15A is a schematic partial enlarged diagram of an area C3 in FIG. 8. In some examples as shown in FIG. 15A, the test unit may include three test transistors (e.g. a first test transistor TC1, a second test transistor TC2, and a third test transistor TC3). The first test transistor TC1 and the third test transistor TC3 are sequentially arranged along the first direction X, and the second test transistor TC2 is located on a side of the first test transistor TC1 and the third test transistor TC3 in the second direction Y. The three test transistors are arranged in a shape of a Chinese character "品", for example.

Figure 15B:
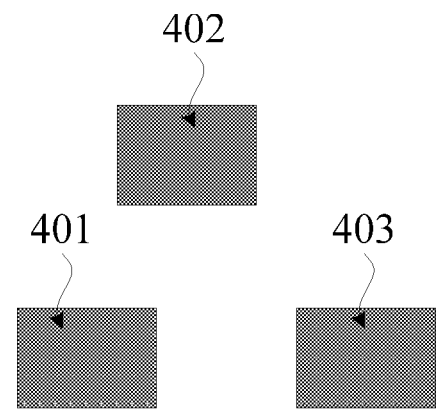
FIG. 15B is a schematic diagram of a test unit after a semiconductor layer is formed in FIG. 15A.
Figure 15C:
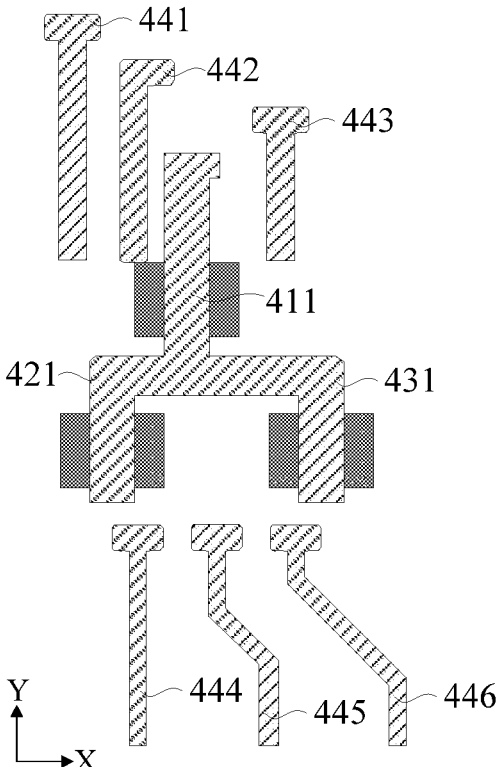
FIG. 15C is a schematic diagram of a test unit after a first gate metal layer is formed in FIG. 15A.
Figure 15D:
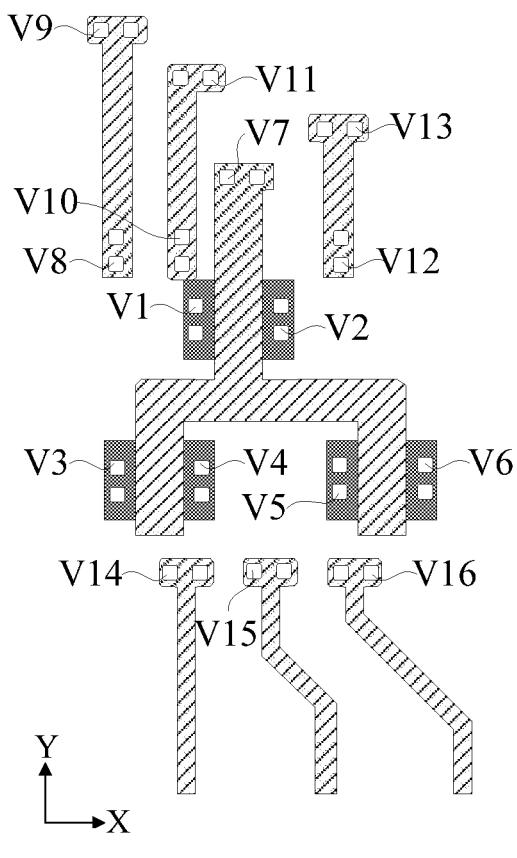
FIG. 15D is a schematic diagram of a test unit after a third insulation layer is formed in FIG. 15A.

FIG. 15B is a schematic diagram of a test unit after a semiconductor layer is formed in FIG. 15A FIG. 15C is a schematic diagram of a test unit after a first gate metal layer is formed in FIG. 15A. FIG. 15D is a schematic diagram of a test unit after a third insulation layer is formed in FIG. 15A.

In some examples as shown in FIG. 15A and FIG. 15B, an orthographic projection of the first active layer 401 of the first test transistor TC1, an orthographic projection of the second active layer 402 of the second test transistor TC2, and an orthographic projection of the third active layer 403 of the third test transistor TC3 on the base substrate may all be rectangular. The first active layer 401, the second active layer 402, and the third active layer 403 may be arranged in a shape of a Chinese character "品".

In some examples as shown in FIG. 15A and FIG. 15C, a first gate electrode 411 of the first test transistor TC1, a second gate electrode 421 of the second test transistor TC2, and a third gate electrode 431 of the third test transistor TC3 may be an integral structure. The first gate metal layer of the test unit may also include first data connection lines 441, 442, and 443, and third data connection lines 444, 445, and 446. The third data connection lines 444, 445, and 446 may be located on a side of the active layers of the three test transistors close to the display area, and may extend to a side of the display area along the second direction Y, so as to be electrically connected with the data line of the display area. The first data connection lines 441, 442, and 443 may be located on a side of the active layers of the three test transistors away from the display area, and may extend to a side of the display area away from the display area along the second direction Y, so as to be electrically connected with the test data line. The first data lines 441, 442, and 443 may be sequentially arranged along the first direction X, and the third data connection lines 444, 445, and 446 may be sequentially arranged along the first direction X.

In some examples as shown in FIG. 15A and FIG. 15D, the third insulation layer of the second frame is provided with multiple vias, which may include, for example, a first via V1 to a sixteenth via V16. Among them, the third insulation layer, the second insulation layer, and the first insulation layer in the first via V1 to the sixth via V6 can be removed to expose surfaces of the active layers of the three test transistors. The third insulation layer and the second insulation layer in the seventh via V7 to the sixteenth via V16 can be removed to expose a surface of the first gate metal layer of the test unit.

In some examples as shown in FIG. 15A to FIG. 15D, the first source-drain metal layer of the test unit may include a test control signal line 45, a first test data line 46-1, a second test data line 46-2, a third test data line 46-3, and the first electrodes and the second electrodes of the three test transistors. A first initial signal line INIT1 and a second peripheral power supply connection line 324 may be disposed on a side of the three test transistors close to the display area. The first initial signal line INIT1 and the second peripheral power supply connection line 324 may be a closed loop trace annularly around the display area. The second peripheral power supply connection line 324 may be electrically connected with a high potential power supply line (VDD) of the display area. The second peripheral power supply connection line 324 may also be electrically connected with the second power supply line 322.

In some examples as shown in FIG. 15A to FIG. 15D, the first electrode 471 of the first test transistor T1 may be electrically connected with the first active layer 401 through two third vias V3 disposed vertically, and it may also be electrically connected with a first data connection line 441 through two eighth vias V8 disposed vertically. The second electrode 472 of the first test transistor T1 may be electrically connected with the first active layer 401 through two fourth vias V4 disposed vertically, and it may also be electrically connected with a third data connection line 444 through two fourteenth vias V14 disposed horizontally. The first electrode 473 of the second test transistor T2 may be electrically connected with the second active layer 402 through two first vias V1 disposed vertically, and it may also be electrically connected with a first data connection line 442 through two tenth vias V10 disposed vertically. The second electrode 474 of the second test transistor T2 may be electrically connected with the second active layer 402 through two second vias V2 disposed vertically, and may be electrically connected with a third data connection line 445 through two fifteenth vias V15 disposed horizontally. The first electrode 476 of the third test transistor T3 may be electrically connected with the third active layer 403 through two sixth vias V6 disposed vertically, and it may also be electrically connected with a first data connection line 443 through two twelfth vias V12 disposed vertically. The second electrode 475 of the third test transistor T3 may be electrically connected with the third active layer 403 through two fifth vias V5 disposed vertically, and it may also be electrically connected with a third data connection line 446 through two sixteenth vias V16 disposed horizontally.

In some examples as shown in FIG. 15A to FIG. 15D, the first data connection line 441 may be electrically connected with the first test data line 46-1 through two ninth via holes V9 disposed horizontally. The first data connection line 442 may be electrically connected with the second test data line 46-2 through two eleventh vias V11 disposed horizontally. The first data connection line 443 may be electrically connected with the third test data line 46-3 through two thirteenth vias V13 disposed horizontally. The test control signal line 45 may be electrically connected with the second gate 421 through two seventh vias V7 disposed horizontally. In some examples, the first test data line 46-1, the second test data line 46-2, the third test data line 46-3, and the test control signal line 45 may be electrically connected with the first signal lead line, respectively, and electrically connected with the test signal access pin through the first signal lead line to receive the test data signal and the test control signal, respectively.

In the present disclosure, "disposed horizontally" may mean being arranged along the first direction X, and "disposed vertically" may mean being arranged along the second direction Y.

In this example, a test transistor of a test unit may be electrically connected with multiple test data lines through a first data connection line located in the first gate metal layer. Since a parasitic capacitance generated per unit area where the first gate metal layer is overlapped with the first source-drain metal layer is smaller than a parasitic capacitance generated per unit area where the second gate metal layer is overlapped with the first source-drain metal layer, by disposing the first data connection line in the first gate metal layer, the parasitic capacitance can be effectively reduced, thereby achieving the effect of reducing the load and optimizing the test effect.

In some examples, multiple multiplexer circuits (MUX) disposed in the first frame of the display substrate may include multiple multiplexer control signal lines, multiple multiplexer data lines, and multiple multiplexer units, each of the multiplexer units is electrically connected with multiple data lines in the display area; the multiplexer unit is configured to, according to the control of the multiple multiplexer control signal lines, provide a signal (data signal) of a multiplexer data signal line to the multiple data lines connected with the multiplexer unit in a time division manner.

Figure 16:
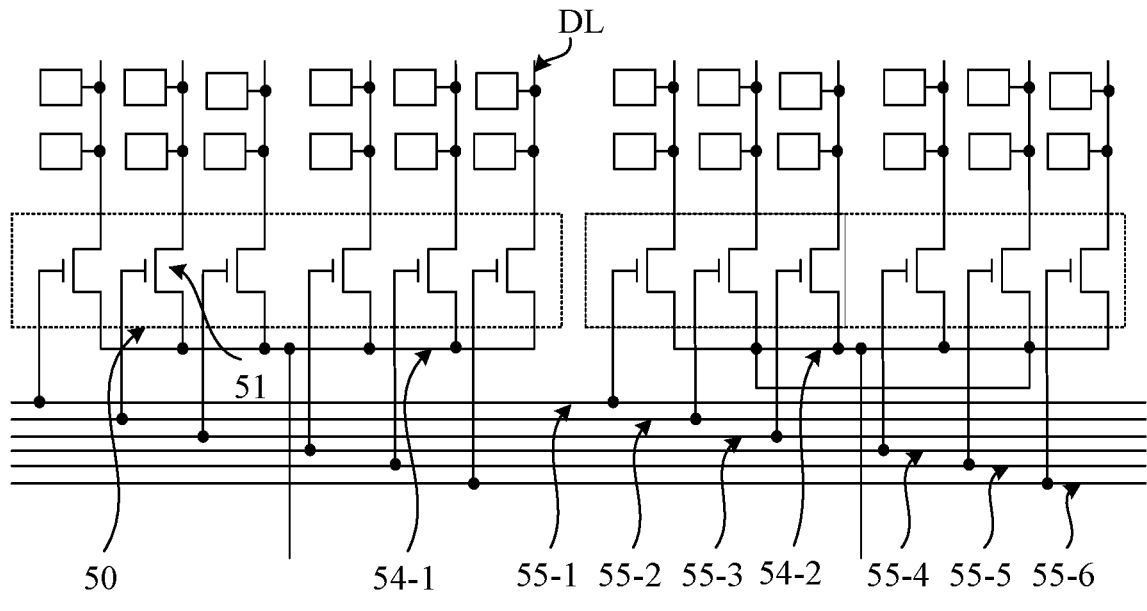
FIG. 16 is an equivalent circuit diagram of multiple multiplexer circuits according to at least one embodiment of the present disclosure.

FIG. 16 is an equivalent circuit diagram of multiple multiplexer circuits according to at least one embodiment of the present disclosure. In some examples, the multiple multiplexer circuits may include n2 multiplexer control signal lines, at least one multiplexer data line and m2 multiplexer units 50, at least one of the m2 multiplexer units may include n2 multiplexer transistors, and m2 and n2 may be positive integers greater than or equal to 2. FIG. 16 takes six multiplexer control signal lines, two multiplexer data lines and a multiplexer unit including six multiplexer transistors as an example for illustration. As shown in FIG. 16, among the six multiplexer transistors 51 of a same multiplexer unit 50, the gate electrodes of the six multiplexer transistors 51 are connected with different multiplexer control signal lines; namely, a gate electrode of a first multiplexer transistor is connected with a first multiplexer control signal line 55-1, a gate electrode of a second multiplexer transistor is connected with a second multiplexer control signal line 55-2, a gate electrode of a third multiplexer transistor is connected with a third multiplexer control signal line 55-3, a gate electrode of a fourth multiplexer transistor is connected with a fourth multiplexer control signal line 55-4, a gate electrode of a fifth multiplexer transistor is connected with a fifth multiplexer control signal line 55-5, and a gate electrode of a sixth multiplexer transistor is connected with a sixth multiplexer control signal line 55-6. First electrodes of the six multiplexer transistors 51 are all connected with a same multiplexer data line, that is, first electrodes of the first multiplexer transistor to the sixth multiplexer transistor in the first multiplexer unit 50 are all connected with the first multiplexer data line 54-1, and the first electrodes of the first multiplexer transistor to the sixth multiplexer transistor in the second multiplexer unit 50 are all connected with the second multiplexer data line 54-2. Second electrodes of the six multiplexer transistors 51 are respectively connected with different data lines DL in the display area, that is, a second electrode of the first multiplexer transistor is connected with a data line DL in the display area, and a second electrode of the second multiplexer transistor is connected with another data signal line DL in the display area, and so on. During display process, a control apparatus provides a conduction signal to the six multiplexer control signal lines in a time division manner, so that the six multiplexer transistors 51 in each multiplexer unit 50 are conducted at different time; when any one of the multiplexer transistor 51 is conducted, the multiplexer data line supplies the data signal required by a data line connected with the conducted multiplexer transistor 51, and the data line writes the data signal into the corresponding sub-pixel.

In some examples, the number of the data lines may be equal to m2×n2. By disposing multiple multiplexer circuits, one signal source (for example, a pin of the drive chip) may provide data signals for multiple data lines, which can greatly reduce the actual quantity of signal sources and simplify the product structure. In other examples, a multiplexer unit 50 may include three multiplexer transistors 51 controlling three data lines (i.e., one controls three).

Figures 17A, 17B:
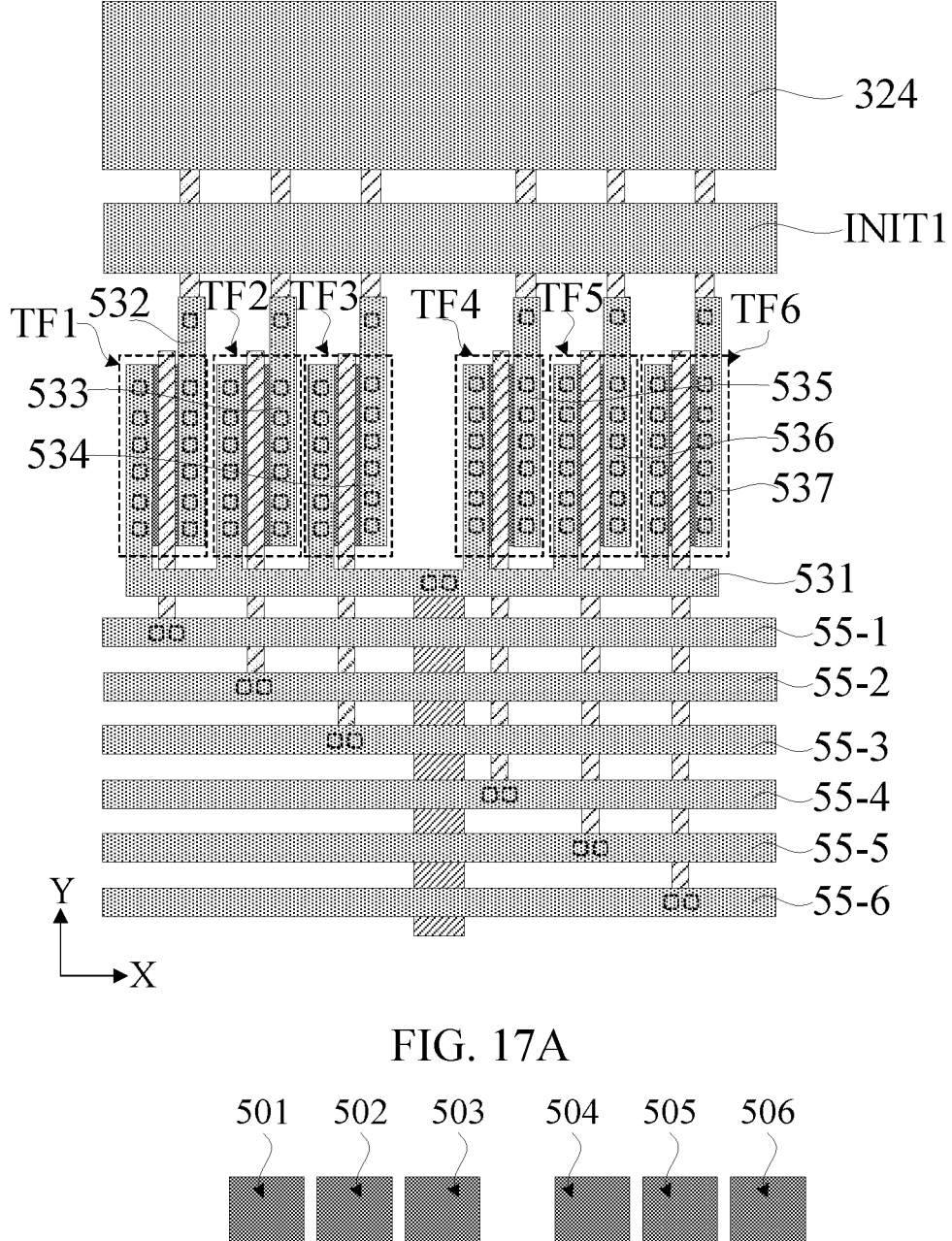
FIG. 17A is a schematic diagram of a structure of a multiplexer unit according to at least one embodiment of the present disclosure.
FIG. 17B is a schematic diagram of a multiplexer unit after a semiconductor layer is formed in FIG. 17A.

FIG. 17A is a schematic diagram of a structure of a multiplexer unit according to at least one embodiment of the present disclosure. FIG. 17A is a schematic partial enlarged view of an area C4 in FIG. 8. In some examples as shown in FIG. 17A, the multiplexer unit may include six multiplexer transistors (e.g., a first multiplexer transistor TF1 to a sixth multiplexer transistor TF6). The first multiplexer transistor TF1 to the sixth multiplexer transistor TF6 may be sequentially arranged along the first direction X.

Figure 17C:
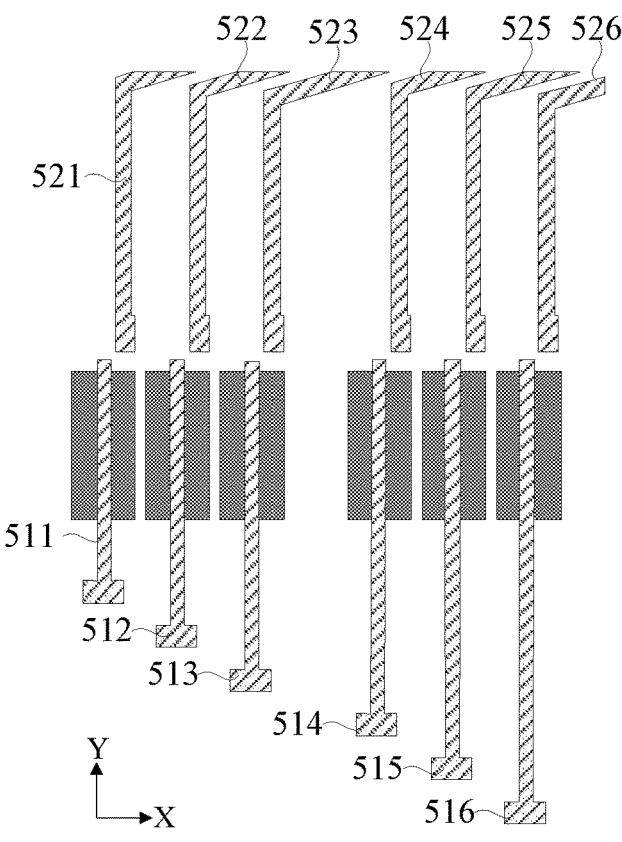
FIG. 17C is a schematic diagram of a multiplexer unit after a first gate metal layer is formed in FIG. 17A.
Figure 17D:
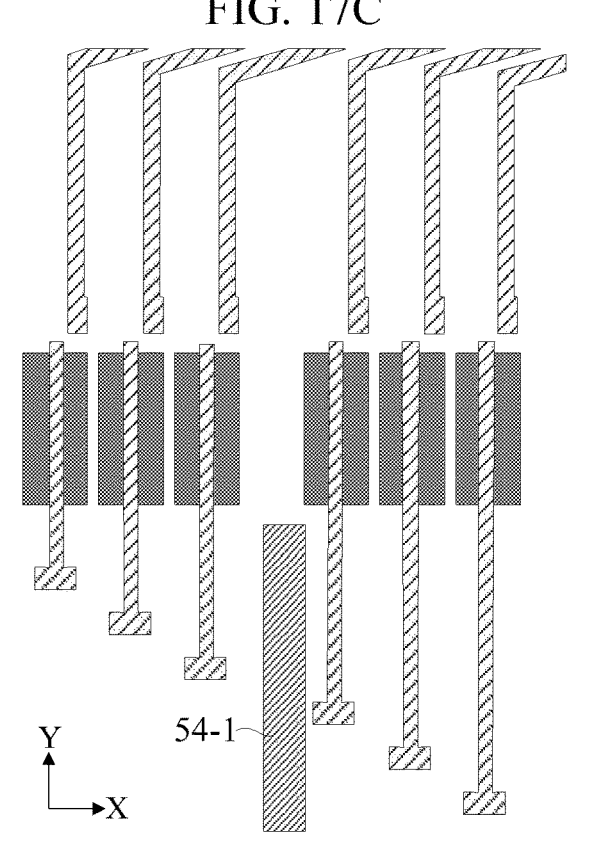
FIG. 17D is a schematic diagram of a multiplexer unit after a second gate metal layer is formed in FIG. 17A.
Figure 17E:
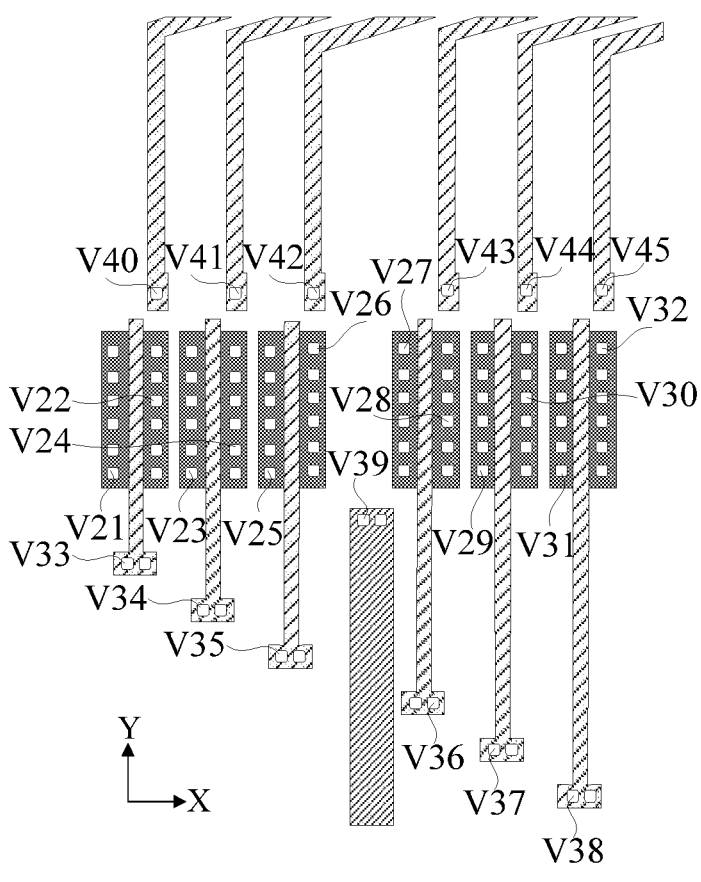
FIG. 17E is a schematic diagram of a multiplexer unit after a third insulation layer is formed in FIG. 17A.

FIG. 17B is a schematic diagram of a multiplexer unit after a semiconductor layer is formed in FIG. 17A. FIG. 17C is a schematic diagram of a multiplexer unit after a first gate metal layer is formed in FIG. 17A. FIG. 17D is a schematic diagram of a multiplexer unit after a second gate metal layer is formed in FIG. 17A. FIG. 17E is a schematic diagram of a multiplexer unit after a third insulation layer is formed in FIG. 17A.

In some examples as shown in FIG. 17A and FIG. 17B, an orthographic projection of the first active layer 501 of the first multiplexer transistor TF1, an orthographic projection of the second active layer 502 of the second multiplexer transistor TF2, an orthographic projection of the third active layer 503 of the third multiplexer transistor TF3, an orthographic projection of the fourth active layer 504 of the fourth multiplexer transistor TF4, an orthographic projection of the fifth active layer 505 of the fifth multiplexer transistor TF5, and an orthographic projection of the sixth active layer 506 of the sixth multiplexer transistor TF6 on the base substrate may be rectangular, and can be sequentially arranged along the first direction X.

In some examples as shown in FIG. 17A and FIG. 17C, the first gate metal layer of the multiplexer unit may include gate electrodes of multiple multiplexer transistors and multiple second data connection lines (e.g., second data connection lines 521 to 526). The first gate electrode 511 of the first multiplexer transistor TF1, the second gate electrode 512 of the second multiplexer transistor TF2, the third gate electrode 513 of the third multiplexer transistor TF3, the fourth gate electrode 514 of the fourth multiplexer transistor TF4, the fifth gate electrode 515 of the fifth multiplexer transistor TF5, and the sixth gate electrode 516 of the sixth multiplexer transistor TF6 may be sequentially arranged along the first direction X, and a length may be gradually increased along the second direction Y. The second data connection lines 521 to 526 may be sequentially arranged along the first direction X. The second data connection lines 521 to 526 may extend toward a side of the display area so as to be electrically connected with the data lines of the display area.

In some examples as shown in FIG. 17A and FIG. 17D, the second gate metal layer of the multiplexer unit may include a multiplexer data line 54-1. The multiplexer data line 54-1 may be located on a side of the active layer of the multiplexer transistor away from the display area.

In some examples as shown in FIG. 17A and FIG. 17E, the third insulation layer of the first frame is provided with multiple vias, which may include, for example, a twenty-first via V21 to a forty-fifth via V45. The third insulation layer, the second insulation layer, and the first insulation layer in the vias of the twenty-first via V21 to the thirty-second via V32 may be removed to expose a surface of the active layer of the six multiplexer transistors of the multiplexer unit. The third insulation layer and the second insulation layer in the thirty-third via V33 to thirty-eighth via V38 and the fortieth via V40 to the forty-fifth via V45 may be removed to expose a surface of the first gate metal layer. The third insulation layer in the thirty-ninth via V39 is removed to expose a surface of the second gate metal layer.

In some examples as shown in FIG. 17A to 17E, the first source-drain metal layer of the multiplexer unit may include first electrodes and second electrodes of the six multiplexer transistors, a first multiplexer control signal lines 55-1 to a sixth multiplexer control signal lines 55-6. A first initial signal line INIT1 and a second peripheral power supply connection line 324 may be provided on a side of the six multiplexer transistors close to the display area.

In some examples as shown in FIG. 17A to FIG. 17E, the first electrode of the first multiplexer transistor TF1, the first electrode of the second multiplexer transistor TF2, the first electrode of the third multiplexer transistor TF3, the first electrode of the fourth multiplexer transistor TF4, the first electrode of the fifth multiplexer transistor TF5, and the first electrode of the sixth multiplexer transistor TF6 may be an integral structure. The first electrode 531 of the first multiplexer transistor TF1 may be electrically connected with the first active layer 501 through six twenty-first vias V21 arranged vertically, it may also be electrically connected with the second active layer 502 through six twenty-third vias V23 arranged vertically, it may also be electrically connected with the third active layer 503 through six twenty-fifth vias V25 arranged vertically, it may also be electrically connected with the fourth active layer 504 through six twenty-seventh vias V27 arranged vertically, it may also be electrically connected with the fifth active layer 505 through six twenty-ninth vias V29 arranged vertically, it may also be electrically connected with the sixth active layer 506 through six thirty-first vias V31 arranged vertically, and it may also be electrically connected with the multiplexer data line 54-1 through six thirty-ninth vias V39 arranged horizontally.

In some examples as shown in FIG. 17A to FIG. 17E, the second electrode 532 of the first multiplexer transistor TF1 may be electrically connected with the first active layer 501 through six twenty-second vias V22 arranged vertically, and it may also be electrically connected with the second data connection line 521 through the fortieth via V40. The second electrode 533 of the second multiplexer transistor TF2 may be electrically connected with the second active layer 502 through six twenty-fourth vias V24 arranged vertically, and it may also be electrically connected with the second data connection line 522 through a forty-first via V41. The second electrode 534 of the third multiplexer transistor TF3 may be electrically connected with the third active layer 503 through six twenty-sixth vias V26 arranged vertically, and it may also be electrically connected with the second data connection line 523 through a forty-second via V42. The second electrode 535 of the fourth multiplexer transistor TF4 may be electrically connected with the fourth active layer 504 through six twenty-eighth vias V28 arranged vertically, and it may also be electrically connected with the second data connection line 524 through a forty-third via V43. The second electrode 536 of the fifth multiplexer transistor TF5 may be electrically connected with the fifth active layer 505 through six thirtieth vias V30 arranged vertically, and it may also be electrically connected with the second data connection line 525 through a forty-fourth via V44. The second electrode 537 of the sixth multiplexer transistor TF6 may be electrically connected with the sixth active layer 506 through six thirty-second vias V32 arranged vertically, and it may also be electrically connected with the second data connection line 526 through a forty-fifth via V45.

In some examples as shown in FIG. 17A to FIG. 17E, the first gate electrode 511 of the first multiplexer transistor TF1 may be electrically connected with a first reset control signal line 55-1 through two thirty-third vias V33 arranged horizontally. The second gate electrode 512 of the second multiplexer transistor TF2 may be electrically connected with a second reset control signal line 55-2 through two thirty-fourth vias V34 arranged horizontally. The third gate electrode 513 of the third multiplexer transistor TF3 may be electrically connected with a third reset control signal line 55-3 through two thirty-fifth vias V35 arranged horizontally. The fourth gate electrode 514 of the fourth multiplexer transistor TF4 may be electrically connected with a fourth reset control signal line 55-4 through two thirty-sixth vias V36 arranged horizontally. The fifth gate electrode 515 of the fifth multiplexer transistor TF5 may be electrically connected with a fifth reset control signal line 55-5 through two thirty-seventh vias V37 arranged horizontally. The sixth gate electrode 516 of the sixth multiplexer transistor TF6 may be electrically connected with a sixth reset control signal line 55-6 through two thirty-eighth vias V38 arranged horizontally.

In this example, the multiplexer transistor of the multiplexer unit may be electrically connected with the multiple data lines through the second data connection line located in the first gate metal layer. Since a parasitic capacitance per unit area where the first gate metal layer is overlapped with the first source-drain metal layer is smaller than a parasitic capacitance per unit area where the second gate metal layer is overlapped with the first source-drain metal layer, by disposing the second data connection line in the first gate metal layer, the parasitic capacitance can be effectively reduced, thereby achieving the effect of reducing the load and optimizing the display effect.

A structure of the display substrate according to the present disclosure will be described below through an example of a preparation process of the display substrate. A "patterning process" mentioned in the present disclosure includes processes such as deposition of a film layer, photoresist coating, mask exposure, development, etching, and photoresist stripping. The deposition may be any one or more of sputtering, evaporation, and chemical vapor deposition, the coating may be any one or more of spray coating and spin coating, and the etching may be any one or more of dry etching and wet etching. A "thin film" refers to a layer of a thin film prepared from a material on a base substrate using a process of deposition or coating. If the "thin film" does not need a patterning process in an entire manufacturing process, the "thin film" may also be called a "layer". If the "thin film" needs a patterning process in the entire manufacturing process, the "thin film" is called a "thin film" before the patterning process and is called a "layer" after the patterning process. The "layer" after the patterning process includes at least one "pattern".

"A and B are of a same layer structure" mentioned in the present disclosure means that A and B are formed simultaneously through a same patterning process. A "same layer" does not always mean that thicknesses of layers or heights of layers are the same in a sectional view. "An orthographic projection of A includes an orthographic projection of B" means that the orthographic projection of B falls within a range of the orthographic projection of A, or the orthographic projection of A covers the orthographic projection of B.

In some exemplary implementations, the process for preparing a display substrate of this exemplary embodiment may include following acts.

(1) A base substrate is provided. In some examples, the base substrate 101 may be a rigid substrate, e.g., a glass substrate. However, this embodiment is not limited thereto. For example, the base substrate may be a flexible substrate.

(2) A semiconductor layer is prepared. In some examples, a semiconductor thin film is deposited on the base substrate 101, and the semiconductor thin film is patterned through a patterning process to form the semiconductor layer. As shown in FIG. 3, the semiconductor layer of the display area may at least include an active layer of a transistor of a pixel circuit. As shown in FIG. 15B, the semiconductor layer of the second frame may at least include an active layer of the test transistor. As shown in FIG. 17B, the semiconductor layer of the first frame may at least include an active layer of the multiplexer transistor.

(3) A first gate metal layer is prepared. In some examples, a first insulation film and a first metal thin film are sequentially deposited on the base substrate 101 on which the aforementioned structure is formed, and the first metal film is patterned through a patterning process to form a first insulation layer 11 covering the semiconductor layer and the first gate metal layer disposed on the first insulation layer 11. As shown in FIG. 3, the first gate metal layer of the display area at least includes a gate electrode of a transistor of a pixel circuit and a first capacitor electrode of a storage capacitor. As shown in FIG. 15C, the first gate metal layer of the second frame may at least include a first gate electrode 411 to a third gate electrode 431, first data connection lines 441 to 443, and third data connection lines 444 to 446 of the test transistor. As shown in FIG. 5 and FIG. 17C, the first gate metal layer of the first frame may at least include: multiple data fan-out lines 333, a first peripheral power supply connection line 323, multiple first signal lead lines 341, first sub-pins of multiple signal access pins located in the signal access region B15, first sub-pins of multiple test signal access pins 361 located in the test signal access region, and gates of the multiplexer transistor and second data connection lines 521 to 526.

(4) A second gate metal layer is prepared. In some examples, a second insulation thin film and a second metal thin film are sequentially deposited on the base substrate 101 on which the aforementioned structure is formed, and the second metal thin film is patterned through a patterning process to form a second insulation layer 12 and the second gate metal layer disposed on the second insulation layer 12. As shown in FIG. 3, the second gate metal layer of the display area may at least include a second capacitance electrode of a storage capacitor of a pixel circuit. As shown in FIG. 17D, the second gate metal layer of the first frame may at least include a multiplexer data line 54-1 with which the multiplexer unit is electrically connected.

(5) A third insulation layer is prepared. In some examples, a third insulation thin film is deposited on the base substrate 101 on which the aforementioned structure is formed, and the third insulation thin film is patterned through a patterning process to form the third insulation layer. The third insulation layer 13 is provided with multiple vias or grooves.

(6) A first source-drain metal layer is prepared. In some examples, depositing a third metal thin film on the base substrate 101 on which the aforementioned structure is formed, and patterning the third metal thin film through a patterning process to form the first source-drain metal layer. As shown in FIG. 3, the first source-drain metal layer of the display area may at least include source electrodes and drain electrodes of multiple transistors of the pixel circuit. As shown in FIG. 5 and FIG. 17A, the first source-drain metal layer of the first frame may at least include first power supply lines 321a and 321b, a second power supply line 322, multiple test connection traces 342, a first auxiliary mark 371, a second auxiliary mark 372, a second sub-pin of multiple signal access pins located in a signal access region, a second sub-pin of multiple test signal access pins 361 located in a test signal access region, a first electrode and a second electrode of a multiplexer transistor, and multiple multiplexer control signal lines. The test connection traces 342 may be electrically connected with the first signal lead line 341 through vias provided in the third insulation layer and the second insulation layer. The second sub-pin of the test signal access pin 361 may be electrically connected with the corresponding first sub-pin through a groove provided by the third insulation layer and the second insulation layer. The second sub-pin of the signal access pin may be electrically connected with the corresponding first sub-pin through the groove provided by the third insulation layer and the second insulation layer. As shown in FIG. 15A, the first source-drain metal layer of the second frame may at least include a first electrode and a second electrode of the test transistor and multiple test data lines. The test data line can be electrically connected with the first data connection line through a via provided by the third insulation layer and the second insulation layer.

At this moment, the preparation of a circuit structure layer of the display area on the base substrate 101 is completed, as shown in FIG. 3. In some examples, the first insulation thin film to the third insulation thin film may be all made of an inorganic material, for example, any one or more of silicon oxide (SiOx), silicon nitride (SiNx), and silicon oxynitride (SiON), and may be a single layer, a multi-layer, or a composite layer.

(7) A planarization layer, a light-emitting structure layer, and an encapsulation layer are sequentially prepared on the base substrate. In some examples, a planarization thin film is coated on the base substrate 101 on which the aforementioned structure is formed, and the first planarization layer 14 is formed through a patterning process. Part of the first planarization layer 14 is reserved in the first frame B1 to cover the connection position of the test connection trace 342 and the first signal lead line 341.

Afterwards, a first conductive thin film is deposited in the display area, and the first conductive thin film is patterned through a patterning process to form a pattern of an anode layer. The anode of the anode layer can be electrically connected with the pixel circuit through a via in the first planarization layer. Then, coating with a pixel definition thin film is performed, and a pattern of a pixel definition layer is formed by masking, exposure and development processes. The pixel definition layer is formed in the display area. A pixel opening is formed on the pixel definition layer in the display area. The pixel definition thin film in the pixel opening is removed by development to expose a surface of an anode. Subsequently, the organic light-emitting layer and the cathode are sequentially formed on the base substrate on which the aforementioned pattern is formed. For example, the organic light-emitting layer includes a hole injection layer, a hole transport layer, a light-emitting layer, an electron transport layer, and an electron injection layer that are stacked, and it is formed in the pixel opening of the display area, to connect the organic light-emitting layer with the anode. A part of a cathode is formed on the organic light-emitting layer.

In some examples, the encapsulation structure layer is formed on the base substrate on which the aforementioned pattern is formed. The encapsulation structure layer may be formed in the display area, and may adopt a stacked structure of inorganic material/organic material/inorganic material. An organic material layer is disposed between two inorganic material layers.

In some exemplary implementations, the first planarization layer and the pixel definition layer may be made of an organic material such as polyimide, acrylic, or polyethylene terephthalate.

In the aforementioned preparation process, preparation processes of a scan drive circuit and a light-emitting drive circuit of the frame area are similar to a preparation process of the circuit structure layer of the display area, and thus it will not be repeated herein.

In some examples, after fabrication of the encapsulation structure layer is completed, the base substrate and the encapsulation cover plate may be attached by an encapsulation process, then a single display substrate may be obtained by cutting, and the encapsulation cover plate is cut according to the first cutting path to expose the signal access pin of the signal access region and the test signal access pin of the test signal access region. In some examples, a side of the encapsulation cover plate away from the base substrate may be provided with a touch structure layer to form a touch display substrate. However, this embodiment is not limited thereto.

The preparation process according to this exemplary embodiment may be achieved using an existing mature preparation device, may be well compatible with an existing manufacturing process. The process is simple to achieve, easy to implement, high in an efficiency of production, low in a production cost, and high in a yield.

The structure of the display substrate according to this exemplary embodiment and the preparation process thereof are described only illustratively. In some exemplary implementations, a corresponding structure may be changed and a patterning process may be increased or decreased according to actual needs. For example, a display area may be provided with a first source-drain metal layer and a second source-drain metal layer, the first source-drain metal layer may include a source electrode and a drain electrode of a transistor, and the second source-drain metal layer may include a connection electrode between a light-emitting element and the drain electrode of the transistor. At this time, the first encapsulation adhesive base substrate and the test connection trace may be located in the second source-drain metal layer; or, the first encapsulation adhesive base substrate may be located in the second source-drain metal layer, and the test connection trace may be located in the first source-drain metal layer. However, this embodiment is not limited thereto.

An embodiment of the present disclosure further provides a display apparatus including the display substrate of the above embodiments. The display substrate may be an OLED display substrate. The display apparatus may be any product or component with a display function, such as an OLED display apparatus, a mobile phone, a tablet computer, a television, a display, a notebook computer, a digital photo frame, or a navigator. However, this embodiment is not limited thereto.

The drawings of the present disclosure only involve structures involved in the present disclosure, and other structures may refer to conventional designs. The embodiments of the present disclosure and features in the embodiments may be combined to each other to obtain new embodiments if there is no conflict. Those of ordinary skills in the art should understand that modifications or equivalent replacements of the technical solutions of the present disclosure may be made without departing from the spirit and scope of the technical solutions of the present disclosure, and shall all fall within the scope of the claims of the present disclosure.

The invention claimed is:

1. A display substrate, comprising:

a base substrate, at least comprising a display area and a peripheral area located at a side of the display area;

a first encapsulation adhesive base substrate, located in the peripheral area; and a plurality of first signal lead lines, a plurality of test connection traces, and a plurality of test signal access pins, located on a side of the first encapsulation adhesive base substrate away from the display area;

wherein at least one first signal lead line is electrically connected with at least one test signal access pin through at least one test connection trace; a connection position of the at least one first signal lead line and the at least one test connection trace is not overlapped with an orthographic projection of the first encapsulation adhesive base substrate on the base substrate, the display substrate further comprises a plurality of multiplexer circuits, wherein the plurality of multiplexer circuits comprise at least one multiplexer unit, the multiplexer unit comprises a plurality of multiplexer transistors, first electrodes of the plurality of multiplexer transistors are electrically connected with a multiplexer data line, second electrodes of the plurality of multiplexer transistors are electrically connected with different data lines of the display area through second data connection lines, and gate electrodes of the plurality of multiplexer transistors are electrically connected with different multiplexer control signal lines.

2. The display substrate according to claim 1, further comprising an encapsulation cover plate disposed on the base substrate, wherein the connection position of the at least one first signal lead line and the at least one test connection trace is away from the encapsulation cover plate.

3. The display substrate according to claim 1, wherein the peripheral area comprises: at least one test signal access region located on a side of the display area, a first area located between the display area and the test signal access region;

the plurality of test signal access pins are located in the test signal access region, and the first encapsulation adhesive base substrate, the plurality of first signal lead lines, and the plurality of test connection traces are at least located in the first area.

4. The display substrate according to claim 1, further comprising a first organic insulation layer disposed on the base substrate, wherein an orthographic projection of the first organic insulation layer on the base substrate covers the connection position of the at least one first signal lead line and the at least one test connection trace.

5. The display substrate according to claim 4, wherein a distance between an edge of the first organic insulation layer close to the display area and an edge of the first encapsulation adhesive base substrate on a side away from the display area is greater than or equal to 50 microns.

6. The display substrate according to claim 1, wherein the plurality of first signal lead lines are configured to transmit at least one of the following signals: a scan start signal, a scan clock signal, a light-emitting start signal, a light-emitting clock signal, a drive power supply signal, a test data signal, and a test control signal.

7. The display substrate according to claim 1, wherein in a direction perpendicular to the display substrate, the first encapsulation adhesive base substrate and the plurality of test connection traces are located on a side of the plurality of first signal lead lines away from the base substrate.

8. The display substrate according to claim 7, wherein the first encapsulation adhesive base substrate and the plurality of test connection traces are in a same layer structure.

9. The display substrate according to claim 1, wherein the peripheral area comprises: a signal access region and a test signal access region located on a side of the display area along a second direction, the signal access region is adjacent to the test signal access region in a first direction, and the first direction intersects with the second direction; the plurality of test signal access pins are located in the test signal access region;

the signal access region comprises a plurality of signal access pins disposed on the base substrate;

the at least one first signal lead line is electrically connected with at least one signal access pin.

10. The display substrate according to claim 9, further comprising: at least one first auxiliary mark, wherein the first auxiliary mark is located on a side of the test signal access region away from the signal access region in the first direction;

the plurality of test connection traces are located between the first auxiliary mark and the first encapsulation adhesive base substrate in the second direction;

the connection position of the at least one first signal lead line and the at least one test connection trace is located on a side of the first auxiliary mark away from the test signal access region in the first direction.

11. The display substrate according to claim 10, further comprising: at least one second auxiliary mark, wherein the second auxiliary mark is located on a side of the first auxiliary mark away from the test signal access region in the first direction;

the connection position of the at least one first signal lead line and the test connection line is located on a side of the second auxiliary mark close to the first auxiliary mark in the first direction.

12. The display substrate according to claim 11, wherein the second auxiliary mark and the first encapsulation adhesive base substrate are an integral structure.

13. The display substrate according to claim 11, wherein the at least one first signal lead line comprises a first bent portion protruding toward a side of the second auxiliary mark; the at least one test connection trace is electrically connected with the first bent portion of the at least one first signal lead line.

14. The display substrate according to claim 1, wherein the first encapsulation adhesive base substrate is electrically connected with a first power supply line.

15. The display substrate according to claim 1, further comprising: a second encapsulation adhesive located on the first encapsulation adhesive base substrate.

16. The display substrate according to claim 1, further comprising a test circuit; wherein the test circuit comprises at least one test unit, the test unit comprises a plurality of test transistors, first electrodes of the plurality of the test transistors are respectively electrically connected with different test data lines through a first data connection line, second electrodes of the plurality of test transistors are respectively connected with different data lines of the display area, and gate electrodes of the plurality of test transistors are electrically connected with a test control signal line;

the first data connection line and the gate electrodes of the plurality of test transistors are in a same layer structure.

17. The display substrate according to claim 16, wherein the gate electrodes of the plurality of test transistors of the test unit are an integral structure.

18. The display substrate according to claim 16, wherein the test circuit is located on a side of the display area away from the test signal access region and is electrically connected with a portion of the first signal lead lines.

19. The display substrate according to claim 1, wherein the second data connection line and the gate electrodes of the plurality of multiplexer transistors are in a same layer structure.

20. A display apparatus, comprising the display substrate according to claim 1.

* * * * *